United States Patent
Amahisa et al.

(10) Patent No.: US 10,276,407 B2
(45) Date of Patent: Apr. 30, 2019

(54) SUBSTRATE PROCESSING APPARATUS AND SUBSTRATE PROCESSING METHOD

(71) Applicant: SCREEN Holdings Co., Ltd., Kyoto (JP)

(72) Inventors: Kenji Amahisa, Kyoto (JP); Takeshi Yoshida, Kyoto (JP); Toshimitsu Namba, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 7 days.

(21) Appl. No.: 15/597,574

(22) Filed: May 17, 2017

(65) Prior Publication Data

US 2017/0338131 A1    Nov. 23, 2017

(30) Foreign Application Priority Data

May 18, 2016   (JP) ................................ 2016-099403

(51) Int. Cl.
*B08B 3/04*   (2006.01)
*B08B 3/08*   (2006.01)
(Continued)

(52) U.S. Cl.
CPC ........ *H01L 21/67034* (2013.01); *B08B 3/041* (2013.01); *B08B 3/08* (2013.01);
(Continued)

(58) Field of Classification Search
CPC .. B08B 3/041; B08B 3/08; B08B 3/10; H01L 21/67017; H01L 21/67034; H01L 21/67051; H01L 21/6719
(Continued)

(56) References Cited

U.S. PATENT DOCUMENTS

2012/0180828 A1    7/2012   Higashijima et al. ........ 134/198
2013/0014786 A1    1/2013   Ito et al. ......................... 134/34
(Continued)

FOREIGN PATENT DOCUMENTS

JP    2005-142290 A    6/2005
JP    2009-135396 A    6/2009
(Continued)

*Primary Examiner* — Levon J Shahinian
(74) *Attorney, Agent, or Firm* — Ostrolenk Faber LLP

(57) ABSTRACT

The substrate processing apparatus includes a substrate holding unit that holds a substrate horizontally, a substrate rotating unit that rotates the substrate held by the substrate holding unit around a prescribed rotational axis extending along a vertical direction, a processing liquid supply nozzle that moves in a horizontal direction and supplies a processing liquid onto an upper surface of the substrate held by the substrate holding unit, a shielding member that shields an atmosphere between the shielding member and the upper surface of the substrate held by the substrate holding unit from an ambient atmosphere, an inert gas supply unit that supplies an inert gas between the upper surface of the substrate held by the substrate holding unit and the shielding member, and a shielding member rotating unit that rotates the shielding member around the rotational axis. The shielding member includes an annular portion that surrounds the substrate held by the substrate holding unit, and a passage-allowing portion that is provided in the annular portion and allows the processing liquid supply nozzle to pass through the annular portion. The substrate processing apparatus includes a controller that is programmed so as to control the shielding member rotating unit to adjust a position of the passage-allowing portion in the rotational direction such that the processing liquid supply nozzle is to be passed through the annular portion.

8 Claims, 17 Drawing Sheets

(51) Int. Cl.
 *B08B 3/10* (2006.01)
 *H01L 21/67* (2006.01)

(52) U.S. Cl.
 CPC .......... *B08B 3/10* (2013.01); *H01L 21/67017* (2013.01); *H01L 21/6719* (2013.01); *H01L 21/67051* (2013.01)

(58) Field of Classification Search
 USPC ......... 134/56 R, 95.2, 99.1, 104.1, 177, 198, 134/902
 See application file for complete search history.

(56) References Cited

U.S. PATENT DOCUMENTS

| | | |
|---|---|---|
| 2015/0027503 A1 | 1/2015 | Takiguchi et al. |
| 2015/0234296 A1 | 8/2015 | Yagi |

FOREIGN PATENT DOCUMENTS

| | | |
|---|---|---|
| JP | 2009-218404 A | 9/2009 |
| JP | 2010-056218 A | 3/2010 |
| JP | 2014-003323 A | 1/2014 |
| JP | 2015-005771 A | 1/2015 |
| JP | 2015-026744 A | 2/2015 |
| KR | 10-2012-0083841 A | 7/2012 |

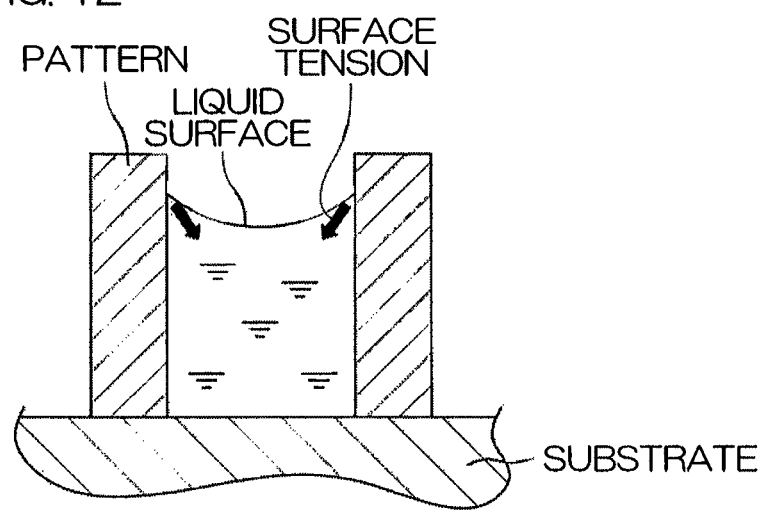

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for processing a substrate. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus that processes a substrate one by one, for example, a chemical liquid is supplied to the substrate that is held substantially horizontally by a spin chuck. Thereafter, a rinse liquid is supplied to the substrate and the chemical liquid on the substrate is thereby replaced by the rinse liquid. Thereafter, a spin drying step is performed to remove the rinse liquid on the substrate.

When as shown in FIG. 12, a fine pattern is formed on a front surface of the substrate, it may not be possible to eliminate the rinse liquid, which has entered into an interior of the pattern, by the spin drying step and drying failure may thereby occur. A liquid surface (an interface of air and liquid) of the rinse liquid that has entered into the interior of the pattern is formed in the interior of the pattern, and therefore surface tension of the liquid acts at positions of contact of the liquid surface and the pattern. When the surface tension is high, pattern collapse occurs readily. Surface tension of water, which is a typical rinse liquid, is high, and therefore pattern collapse in the spin drying step cannot be neglected.

It may therefore be considered to supply isopropyl alcohol (IPA), which is a low surface tension liquid of lower surface tension than water, to replace the water, which has entered into the interior of the pattern, by the IPA and thereafter eliminate the IPA to dry an upper surface of the substrate.

In order to remove the IPA and dry the upper surface of the substrate rapidly, it is necessary to reduce the humidity of the atmosphere near the upper surface of the substrate. Moreover, since the pattern may become oxidized by oxygen dissolved in the IPA, the oxygen concentration of the atmosphere near the upper surface of the substrate must be reduced such that oxygen does not dissolve in the IPA. However, because the spin chuck and other members are housed in the interior space of the processing chamber, the interior space of the processing chamber is relatively large. It is therefore difficult to reduce the oxygen concentration and humidity of the entire atmosphere in the processing chamber.

The substrate processing apparatus described in United States Patent Application Publication No. 2015/234296 has a shielding member disposed above a spin chuck that rotates the substrate around a vertical rotational axis extending through a center portion of the substrate, and a center nozzle extending in the vertical direction along a center line of the shielding member. The shielding member includes a disc portion having a facing surface that faces the upper surface of the substrate held in the spin chuck, and a cylinder portion extending downward from the outer periphery of the disc portion. A downward discharge port that is opened at the center of the facing surface that faces the upper surface of the substrate, is formed in the disc portion. The processing liquid, nitrogen gas and other components are discharged downward from the downward discharge port. A center nozzle discharges the processing liquid downward through the downward discharge port.

SUMMARY OF THE INVENTION

In the substrate processing apparatus of United States Patent Application Publication No. 2015/234296, nitrogen gas is discharged from the downward discharge port in a state where the shielding member is positioned at a proximal position that is at a relatively short distance from the upper surface of the substrate held by the spin chuck to the facing surface of the shielding member, and the space between the substrate and the shielding member thereby becomes filled with nitrogen gas. In this state, the processing liquid can be supplied from the center nozzle to the upper surface of the substrate.

However, depending on the usage of the processing liquid and the specifications of the substrate processing apparatus and so on, it may be desirable to supply the processing liquid to the substrate using a nozzle that is movable in the horizontal direction. In such cases, in order to supply the processing liquid from the nozzle to the substrate, the shielding member must be moved upward such that the nozzle and the cylinder portion of the shielding member do not mutually interfere. The space on the substrate cannot be sufficiently limited, it may thus not be possible to maintain low oxygen concentration and humidity in the atmosphere between the substrate and the shielding member.

An object of the present invention is thus to provide a substrate processing apparatus and a substrate processing method that can supply a processing liquid from a horizontally movable processing liquid supply nozzle to an upper surface of a substrate, in a state where oxygen concentration and humidity in an atmosphere between the upper surface of the horizontally held substrate and the shielding member, is reduced.

The present invention provides a substrate processing apparatus comprising a substrate holding unit that holds a substrate horizontally, a substrate rotating unit that rotates the substrate held by the substrate holding unit around a prescribed rotational axis extending along a vertical direction, a processing liquid supply nozzle that moves in a horizontal direction and supplies a processing liquid onto an upper surface of the substrate held by the substrate holding unit, a shielding member that shields an atmosphere between the shielding member and the upper surface of the substrate held by the substrate holding unit from the ambient atmosphere, and includes an annular portion that surrounds the substrate held by the substrate holding unit and a passage-allowing portion that is provided at the annular portion and allows the processing liquid supply nozzle to pass through the annular portion, an inert gas supply unit that supplies an inert gas between the upper surface of the substrate held by the substrate holding unit and the shielding member, a shielding member rotating unit that rotates the shielding member around the rotational axis, and a controller that is programmed so as to control the shielding member rotating unit to adjust a position of the passage-allowing portion in the rotational direction such that the processing liquid supply nozzle is to be passed through the annular portion.

With this arrangement, the shielding member shields the atmosphere between the shielding member and the upper surface of the substrate from the ambient atmosphere. In this state, inert gas is supplied from the inert gas supply unit to the space between the shielding member and the upper surface of the substrate held by the substrate holding unit. The shielding member includes an annular portion that surrounds the substrate held by the substrate holding unit. Since the space between the shielding member and the upper surface of the substrate held by the substrate holding unit is enclosed, and the atmosphere in the space is thus efficiently replaced with the inert gas. The oxygen concentration and humidity in the atmosphere between the shielding member and the upper surface of the substrate held by the substrate holding unit, is thereby reduced.

By the shielding member being rotated by the shielding member rotating unit, the position of the passage-allowing portion provided at the annular portion in the rotational direction is changed. Then, the controller controls the shielding member rotating unit to adjust the position of the passage-allowing portion in the rotational direction. The processing liquid supply nozzle that moves in the horizontal direction can thus pass through the annular portion of the shielding member through the passage-allowing portion. Consequently, the processing liquid can be supplied from the processing liquid supply nozzle onto the upper surface of the substrate, in the state where oxygen concentration and humidity in the atmosphere between the upper surface of the substrate held by the substrate holding unit, and the shielding member, is reduced.

According to the preferred embodiment of the present invention, the processing liquid supply nozzle moves through the passage-allowing portion, between a location more toward the rotational axis side than the annular portion and a location on an opposite side of the rotational axis with respect to the annular portion.

With this arrangement, the processing liquid supply nozzle moves through the passage-allowing portion, between the location more toward the rotational axis side than the annular portion and the location on the opposite side of the rotational axis with respect to the annular portion. Thus, it is possible to supply the processing liquid from the processing liquid supply nozzle to the upper surface of the substrate held by the substrate holding unit, in a state where oxygen concentration and humidity in the atmosphere between the shielding member and the upper surface of the substrate held by the substrate holding unit, is reduced. Most preferably, the processing liquid supply nozzle provides the processing liquid to a location of the center of rotation of the upper surface of the substrate. The processing liquid is thereby easy to spread over the entire upper surface of the substrate held by the substrate holding unit. The location of the center of rotation of the upper surface of the substrate is a location of the upper surface of the substrate held by the substrate holding unit that crosses with the rotational axis.

According to the preferred embodiment of the present invention, the substrate processing apparatus further comprises a shielding member elevating/lowering unit that elevates and lowers the shielding member. Also, the annular portion further includes a liquid receiver that is provided at upper side than the passage-allowing portion and receives the processing liquid removed off from the substrate.

With this arrangement, by elevating and lowering the shielding member by the shielding member elevating/lowering unit, it is possible to switch a location of the shielding member in the vertical direction, to a location where the passage-allowing portion is positioned at upper side than the upper surface of the substrate held by the substrate holding unit, and to a location where the passage-allowing portion is positioned at lower side than the upper surface of the substrate held by the substrate holding unit.

When the passage-allowing portion is positioned at upper side than the upper surface of the substrate held by the substrate holding unit, the processing liquid supply nozzle is able to pass through the annular portion due to the passage-allowing portion. On the other hand, when the passage-allowing portion is positioned at lower side than the upper surface of the substrate held by the substrate holding unit, the liquid receiver provided at upper side than the passage-allowing portion can receive the processing liquid removed off from the substrate. It can thus be suppressed that the processing liquid removed off from the substrate leaks out to the outside of the annular portion through the passage-allowing portion.

According to the preferred embodiment of the present invention, the shielding member includes a facing portion that faces the upper surface of the substrate held by the substrate holding unit. In addition, the substrate processing apparatus further comprises an annular portion moving mechanism that moves the annular portion vertically with respect to the facing portion.

With this arrangement, the annular portion moving mechanism moves the annular portion vertically with respect to the facing portion that faces the upper surface of the substrate held by the substrate holding unit. Consequently, it is possible to narrow the spacing between the facing portion and the upper surface of the substrate held by the substrate holding unit, and to position the passage-allowing portion above the substrate by moving the annular portion vertically relative to the facing portion. The oxygen concentration and humidity in the atmosphere between the shielding member and the upper surface of the substrate held by the substrate holding unit can thus be rapidly reduced, and the processing liquid supply nozzle can pass through the annular portion via the passage-allowing portion.

According to the preferred embodiment of the present invention, the passage-allowing portion includes a penetrating hole that penetrates through the annular portion. With this arrangement, a simple penetrating hole allows the processing liquid supply nozzle to pass through the annular portion.

According to the preferred embodiment of the present invention, the passage-allowing portion includes a notch where the annular portion is notched upward from the bottom end. With this arrangement, the processing liquid supply nozzle is allowed to pass through the annular portion via the notch.

According to the preferred embodiment of the present invention, the substrate processing apparatus further comprises an axis-shaped nozzle arm that supports the processing liquid supply nozzle and extends in the horizontal direction, and a nozzle rotating unit that rotates the processing liquid supply nozzle around a central axis of the nozzle arm. The processing liquid supply nozzle extends in a direction crossing the central axis of the nozzle arm. The passage-allowing portion also includes a long hole that is long in the horizontal direction and penetrates through the annular portion.

With this arrangement, the processing liquid supply nozzle is supported by the nozzle arm extending in the horizontal direction, and extends in a direction crossing the central axis of the nozzle arm. By being rotated around the central axis of the nozzle arm by the nozzle rotating unit, the processing liquid supply nozzle can pass through the annular portion via the long hole that is long in the horizontal direction and penetrates through the annular portion. Since the long hole is long in the horizontal direction, it is possible to reduce the dimensions of the annular portion in the vertical direction, in comparison with an arrangement in which the long hole is long in a direction other than the horizontal direction. The space between the shielding member and the upper surface of the substrate held by the substrate holding unit is thereby narrowed, and the oxygen concentration and humidity in the atmosphere between the shielding member and the upper surface of the substrate held by the substrate holding unit, can thus be rapidly reduced.

According to the preferred embodiment of the present invention, the substrate processing apparatus further comprises a processing liquid passage suppressing unit that suppresses the processing liquid removed off from the substrate held by the substrate-holding unit, from passing through the annular portion via the passage-allowing portion.

With this arrangement, passage of the processing liquid removed off from the substrate held by the substrate-holding unit, through the annular portion via the passage-allowing portion, is suppressed by the processing liquid passage suppressing unit. It is thus allowed that the processing liquid supply nozzle passes through the annular portion, and it is effectively suppressed that the processing liquid that has been removed off from the substrate, passes through the passage-allowing portion, and leaks out to the outside of the annular portion.

A preferred embodiment of the present invention provides a substrate processing method that comprises a substrate rotating step of rotating a substrate which is horizontally held, around a prescribed rotational axis extending along a vertical direction, a shielding member rotating step of rotating a shielding member including an annular portion that surrounds the substrate and that shields the atmosphere between the shielding member and an upper surface of the substrate from an ambient atmosphere, is rotated around the rotational axis, an inert gas supplying step of supplying an inert gas is supplied between the upper surface of the substrate and the shielding member, in a state where the atmosphere between the upper surface of the substrate and the shielding member being shielded from the ambient atmosphere, a position adjusting step of adjusting a position of the passage-allowing portion in the rotational direction by stopping rotation of the shielding member such that a processing liquid supply nozzle that supplies a processing liquid to the upper surface of the substrate can pass through the annular portion via a passage-allowing portion provided in the annular portion, and a nozzle moving step of moving the processing nozzle to a position that the processing nozzle faces the substrate such that the processing liquid supply nozzle is passed through the annular portion via the passage-allowing portion.

According to this method, the inert gas is supplied between the upper surface of the substrate and the shielding member, in a state where the atmosphere between the upper surface of the substrate and the shielding member is shielded from the ambient atmosphere. The shielding member includes an annular portion surrounding the substrate held horizontally, the atmosphere between the shielding member and the upper surface of the horizontally held substrate is thus efficiently replaced with the inert gas. The oxygen concentration and humidity in the atmosphere between the shielding member and the upper surface of the horizontally held substrate, is thereby reduced. Also, the position of the passage-allowing portion provided at the annular portion is changed by rotation of the shielding member. Then, rotation of the shielding member is stopped and the position of the passage-allowing portion in the rotational direction of the shielding member is adjusted, such that the processing liquid supply nozzle can pass through the annular portion via the passage-allowing portion provided in the annular portion. Furthermore, the processing liquid supply nozzle passes through the annular portion via the passage-allowing portion, and moves to a location facing the horizontally held substrate. Consequently, the processing liquid can be supplied from the horizontally movable processing liquid supply nozzle onto the substrate, in the state where oxygen concentration and humidity in the atmosphere between the horizontally held substrate and the shielding member, is reduced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 12 is an illustrative sectional view for describing principles of pattern collapse due to surface tension.

DETAILED DESCRIPTION OF THE PREFERRED EMBODIMENTS

First Preferred Embodiment

Figure 1:
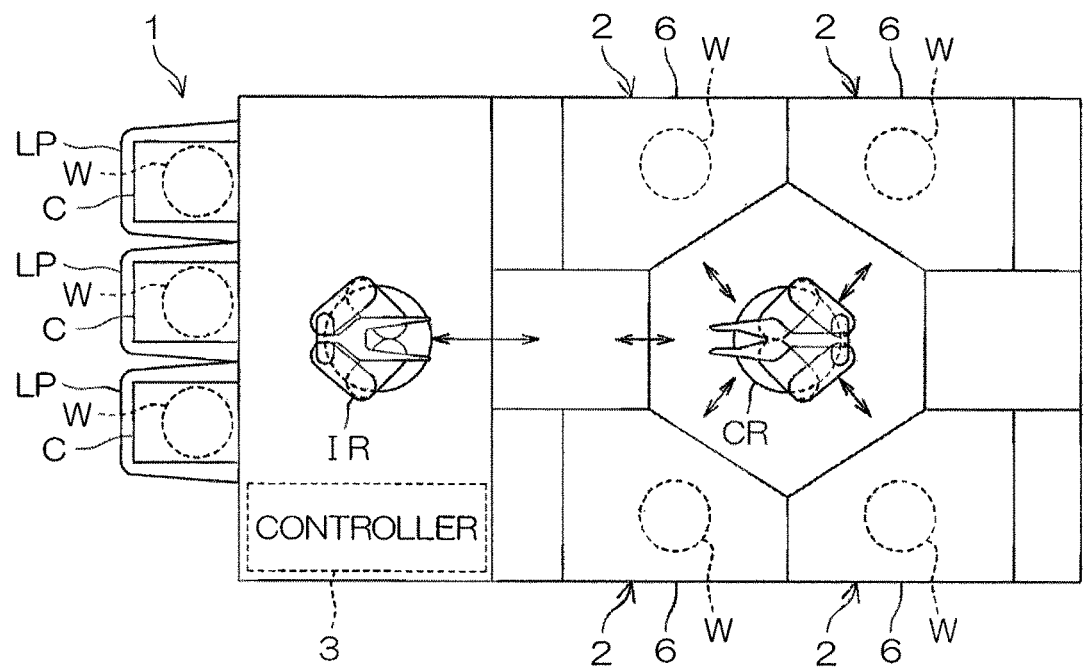
FIG. 1 is an illustrative plan view for describing a layout of an interior of a substrate processing apparatus according to a first preferred embodiment of the present invention.

FIG. 1 is an illustrative plan view for describing a layout of an interior of a substrate processing apparatus 1 according to a first preferred embodiment of the present invention. The substrate processing apparatus 1 is a single substrate processing type apparatus that processes a substrate W such as a silicon wafer, one by one by a processing liquid.

A chemical liquid, a rinse liquid, an organic solvent, etc., can be cited as the processing liquid. In the present preferred embodiment, the substrate W is a circular substrate. A fine pattern (see FIG. 12) is formed on a front surface of the substrate W.

The substrate processing apparatus 1 includes a plurality of processing units 2, each of which processes a substrate W by the processing liquid, a plurality of load ports LP, each of which holds a carrier C that houses a plurality of substrates W to be processed by the processing units 2, transfer robots IR and CR that transport the substrates W between the load ports LP and the processing units 2, and a controller 3 that controls the substrate processing apparatus 1. The transfer robot IR transfers the substrates W between the carriers C and the transfer robot CR. The transfer robot CR transfers the substrates W between the transfer robot IR and the processing units 2. The plurality of processing units 2 have, for example, the same arrangement.

Figure 2:
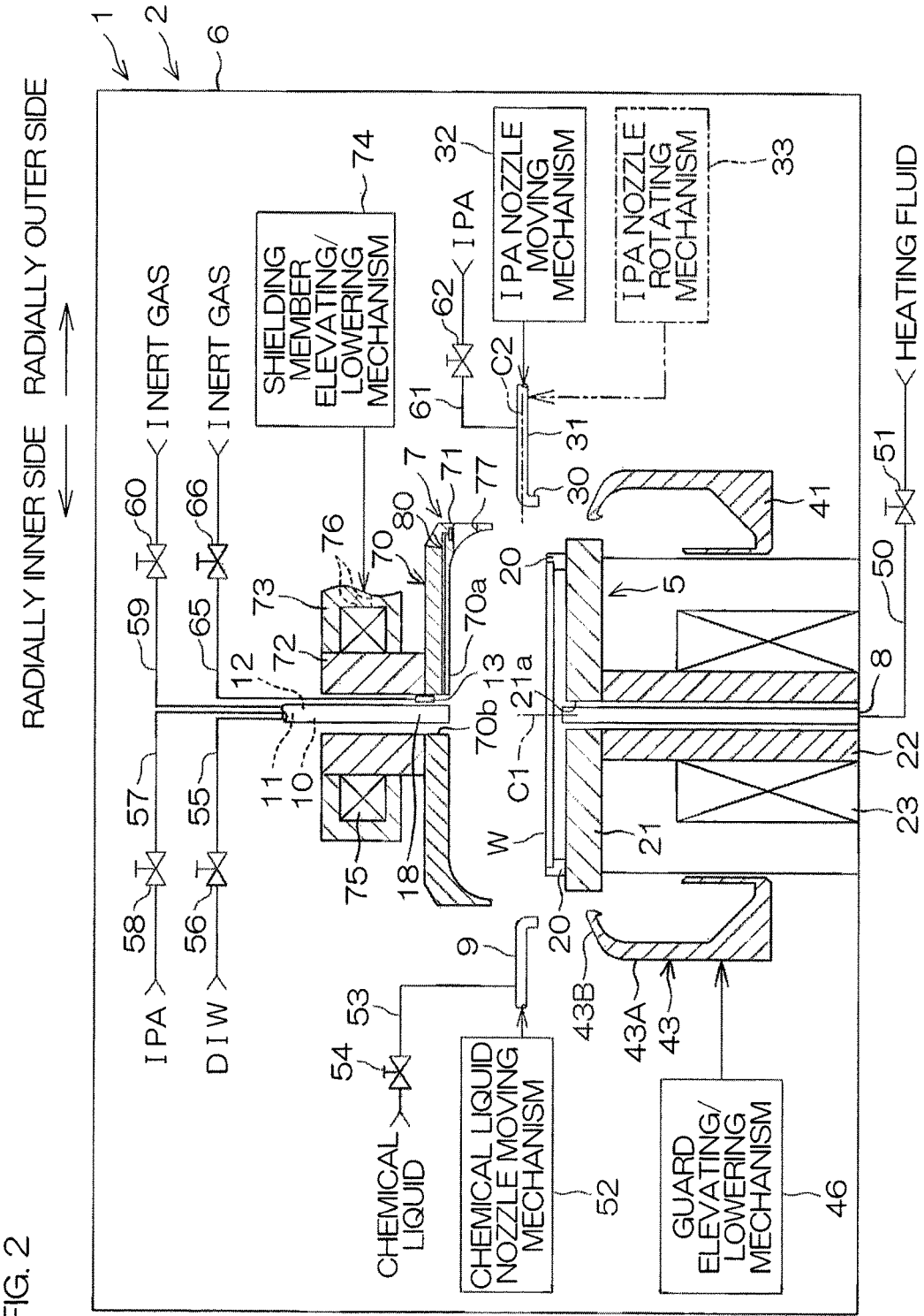
FIG. 2 is an illustrative vertical cross-sectional view for describing an arrangement example of a processing unit included in the substrate processing apparatus.

FIG. 2 is an illustrative vertical cross-sectional view for describing an arrangement example of a processing unit 2.

The processing unit 2 includes a spin chuck 5 that rotates a single substrate W around a vertical rotational axis C1 extending through the center of the substrate W, while holding the substrate W in a horizontal orientation, and a chamber 6 that houses the substrate W for processing of the substrate W with a processing liquid. A carry-in/carry-out port (not shown) for carrying in and carrying out of the substrate W is formed in the chamber 6. A shutter unit (not shown) that opens and closes the carry-in/carry-out port is provided in the carry-in/carry-out port.

The processing unit 2 further includes a shielding member 7 having a facing surface 70a that faces the upper surface of the substrate W. The shielding member 7 shields the atmosphere between the shielding member 7 and the upper surface of the substrate W (the main side on the top), from the ambient atmosphere. The ambient atmosphere is the atmosphere outside of the space partitioned by the shielding member 7 and the upper surface of the substrate W. The shielding member 7 may be any member that can restrict fluid flow of the atmosphere between the shielding member 7 and the upper surface of the substrate W, and the ambient atmosphere, and does not need to be a member that completely shields the atmosphere between the shielding member 7 and the upper surface of the substrate W from the ambient atmosphere.

The spin chuck 5 includes chuck pins 20, a spin base 21, a rotating shaft 22, and an electric motor 23 that rotates the rotating shaft 22 around a prescribed rotational axis C1 along the vertical direction.

The rotating shaft 22 extends in the vertical direction along the rotational axis C1, and in the present preferred embodiment the rotating shaft 22 is a hollow shaft. The upper end of the rotating shaft 22 is coupled to the center of the lower surface of the spin base 21. The spin base 21 has a disk shape along the horizontal direction. The plurality of chuck pins 20 which are configured to grip the substrate W, are disposed at intervals in the circumferential direction at the peripheral edge portion of the upper surface of the spin base 21. The spin base 21 and the chuck pins 20 are included in a substrate holding unit that holds the substrate W horizontally.

The rotating shaft 22 is rotated by the electric motor 23, whereby the substrate W rotates around the rotational axis C1. The inner side in the rotational radius direction of the substrate W will hereunder be referred to simply as "radially inner side," and the outer side in the rotational radius direction of the substrate W will hereunder be referred to simply as "radially outer side." The rotating shaft 22 and electric motor 23 are included in a substrate rotating unit that rotates the substrate W around the rotational axis C1. In the spin base 21 there is formed a communicating hole 21a that vertically penetrates the spin base 21 at a location overlapping with the rotational axis C1, in plan view, and communicates with the interior space of the rotating shaft 22.

The shielding member 7 includes a facing portion 70 that faces the upper surface of the substrate W, and an annular portion 71 that extends downward from the peripheral edge portion of the facing portion 70 so as to surround the substrate W in plan view. The facing portion 70 is formed to a disk shape. The facing portion 70 is disposed essentially horizontally above the spin chuck 5. The facing portion 70 has a facing surface 70a that faces the upper surface of the substrate W. A hollow rotating shaft 72 is fixed to an opposite side surface with respect to the facing surface 70a of the facing portion 70. A communicating hole 70b that vertically penetrates the facing portion 70 and communicates with the interior space of the rotating shaft 72, is formed at a location in the facing portion 70 that overlaps with the rotational axis C1 in plan view.

The processing unit 2 further includes a shielding member support member 73 that extends horizontally and supports the shielding member 7 via the rotating shaft 72, a shielding member elevating/lowering mechanism 74 that is connected to the shielding member 7 via the shielding member support member 73 and drives elevating and lowering of the shielding member 7, and a shielding member rotating mechanism 75 that rotates the shielding member 7 around the rotational axis C1. The shielding member elevating/lowering mechanism 74 is an example of a shielding member elevating/lowering unit. The shielding member rotating mechanism 75 is an example of a shielding member rotating unit.

The shielding member elevating/lowering mechanism 74 includes, for example, a ball screw mechanism (not shown), and an electric motor (not shown) that applies driving force to the ball screw mechanism. The shielding member elevating/lowering mechanism 74 can position the shielding member 7 at any desired position (height) from a lower position (the position shown in FIG. 7G described below) to a higher position (the position shown in FIG. 7A described below). The lower position is a position within the movable range of the shielding member 7, at which the facing surface 70a of the facing portion 70 of the shielding member 7 is most proximal to the upper surface of the substrate W. At the lower position, the distance between the upper surface of the substrate W and the facing surface 70a is no greater than 2.5 mm, for example. The higher position is a position within the movable range of the shielding member 7, at which the facing surface 70a of the facing portion 70 of the shielding member 7 is most distant from the upper surface of the substrate W.

The shielding member 7 can be positioned at a first proximal position and a second proximal position between the higher position and lower position, by the shielding member elevating/lowering mechanism 74. The first proximal position is a position where the facing surface 70a of the shielding member 7 is proximal to the upper surface of the substrate W, and is a position such that the distance between the upper surface of the substrate W and the facing surface 70a is no greater than 7 mm, for example. The second proximal position is a position where the facing surface 70a of the shielding member 7 is proximal to the upper surface of the substrate W, and is a position higher than the first proximal position. The facing surface 70a when the shielding member 7 is positioned at the second proximal position is at a position higher than the facing surface 70a when the shielding member 7 is positioned at the first proximal position. The distance between the facing surface 70a and the upper surface of the substrate W, when the shielding member 7 is positioned at the second proximal position, is approximately 15 mm, for example.

When the shielding member 7 is positioned at the lower position, the first proximal position or the second proximal position, the annular portion 71 faces the substrate W from the horizontal direction. When the annular portion 71 is facing the substrate W from the horizontal direction, the atmosphere between the shielding member 7 and the upper surface of the substrate W is shielded from the ambient atmosphere.

The shielding member rotating mechanism 75 includes an electric motor built into a tip of the shielding member support member 73. A plurality of wirings 76 arranged inside the shielding member support member 73 are connected to the electric motor. The plurality of wirings 76 include a power line for power transmission to the electric motor, and an encoder line for output of rotational information for the shielding member 7. By detecting rotational information for the shielding member 7, it is possible to accurately control rotation of the shielding member 7.

The processing unit 2 further includes a cup 41 that surrounds the spin chuck 5, a guard 43 that receives processing liquid removed off the substrate W from the substrate W held by the spin chuck 5, and a guard elevating/lowering mechanism 46 that drives elevating and lowering of the guard 43.

The cup 41 has a cylindrical shape. The cup 41 is, for example, integrated with the guard 43 and is elevated and lowered together with the guard 43. The cup 41 has an annular groove that opens upward. A recovery tube (not shown) or waste liquid tube (not shown) is connected to the groove of the cup 41. Processing liquid guided to a bottom part of the cup 41 runs through the recovery tube or waste liquid tube and is recovered or discarded.

The guard 43 surrounds the spin chuck 5 and the shielding member 7, in plan view. The guard 43 includes a cylindrical portion 43A that surrounds the spin chuck 5 and the shielding member 7 in plan view, and an extension portion 43B that extends from the cylindrical portion 43A to the radially inner side. The extension portion 43B extends in an inclined direction with respect to the horizontal direction, so as to rise upward toward the radially inner side.

By the guard elevating/lowering mechanism 46, the guard 43 is elevated and lowered between a lower position, at which the upper end of the guard 43 is positioned lower than the upper surface of the substrate W, and a higher position, at which the upper end of the guard 43 is positioned higher than the upper surface of the substrate W.

The guard elevating/lowering mechanism 46 includes, for example, a ball screw mechanism (not shown), and an electric motor (not shown) that applies driving force to the ball screw mechanism.

The processing unit 2 further includes a lower surface nozzle 8 that supplies a heating fluid such as hot water to a center region of the lower surface (the main side of the lower end) of the substrate W, and a chemical liquid nozzle 9 that supplies a chemical liquid such as hydrofluoric acid to the upper surface of the substrate W. The center region of the lower surface of the substrate W is the region around a center of the lower surface of the substrate W, that includes a location of the lower surface of the substrate W that crosses with the rotational axis C1.

The lower surface nozzle 8 is inserted through the rotating shaft 22. The lower surface nozzle 8 has, at its upper end, a discharge port facing the center of the lower surface of the substrate W. A heating fluid is supplied from a heating fluid supply source to the lower surface nozzle 8 via a heating fluid supply pipe 50. The heating fluid supply pipe 50 has interposed therein a heating fluid valve 51 that opens and closes a flow passage thereof. The hot water used as the heating fluid is water at a higher temperature than room temperature, such as 80° C. to 85° C. The heating fluid is not limited to hot water and may be a gas such as high-temperature nitrogen gas. The heating fluid may be any fluid capable of heating the substrate W.

A chemical liquid is supplied from a chemical liquid supply source to the chemical liquid nozzle 9 via a chemical liquid supply pipe 53. The chemical liquid supply pipe 53 has interposed therein a chemical liquid valve 54 that opens and closes a flow passage thereof.

The chemical liquid is not restricted to hydrofluoric acid and may be a liquid including at least one among sulfuric acid, acetic acid, nitric acid, hydrochloric acid, hydrofluoric acid, ammonia water, hydrogen peroxide water, an organic acid (for example, citric acid, oxalic acid, etc.), an organic alkali (for example, TMAH: tetramethylammonium hydroxide, etc.), a surfactant, a corrosion inhibitor. As examples of a chemical liquid in which the above are mixed, SPM (sulfuric acid/hydrogen peroxide mixture), SC1 (ammonia-hydrogen peroxide mixture), etc., can be cited.

The chemical liquid nozzle 9 is moved in the vertical direction and the horizontal direction by a chemical liquid nozzle moving mechanism 52. By movement in the horizontal direction, the chemical liquid nozzle 9 can move between a center position at which the chemical liquid nozzle 9 faces a rotation center position of the upper surface of the substrate W, and a retracted position at which the chemical liquid nozzle 9 does not face the upper surface of the substrate W. The rotation center position of the upper surface of the substrate W is the position of the upper surface of the substrate W that crosses with the rotational axis C1. The retracted position that does not face the upper surface of the substrate W is the position on the outer side of the spin base 21 and the guard 43, in plan view.

The processing unit 2 further includes a DIW nozzle 10, supplying deionized water (DIW) as a rinse liquid to a center region of the upper surface of the substrate W, a central IPA nozzle 11, supplying IPA as an organic solvent to the center region of the upper surface of the substrate W, and a first inert gas nozzle 12, supplying nitrogen gas ($N_2$) or another inert gas to the center region of the upper surface of the substrate W. The center region of the upper surface of the substrate W is a region around a center of the upper surface of the substrate W, that includes the position of the upper surface of the substrate W that crosses with the rotational axis C1. The first inert gas nozzle 12 is included in an inert gas supply unit that supplies an inert gas between the upper surface of the substrate W and the shielding member 7.

According to the present preferred embodiment, the nozzles 10 to 12 are all housed in a nozzle housing member 18 inserted through the rotating shaft 72, and is able to discharge the DIW, IPA and inert gas, respectively. The nozzles 10 to 12 are able to supply the DIW, IPA and inert gas, respectively, to the center region of the upper surface of the substrate W.

DIW is supplied from a DIW supply source to the DIW nozzle 10 via a DIW supply pipe 55. The DIW supply pipe 55 has interposed therein a DIW valve 56 that opens and closes a flow passage thereof.

The DIW nozzle 10 maybe a rinse liquid nozzle that supplies a rinse liquid other than DIW. As examples of the rinse liquid besides DIW, carbonated water, electrolyzed ion water, ozone water, aqueous hydrochloric acid solution of dilute concentration (of, for example, approximately 10 ppm to 100 ppm), or reduced water (hydrogen water), etc., can be cited.

IPA is supplied to the central IPA nozzle 11 from an IPA supply source, via a central IPA supply pipe 57. The central IPA supply pipe 57 has interposed therein a central IPA valve 58 that opens and closes a flow passage thereof.

Although according to the present preferred embodiment the central IPA nozzle 11 is arranged to supply IPA, it suffices that the central IPA nozzle functions as a central low surface tension liquid nozzle that supplies a low surface tension liquid of lower surface tension than the rinse liquid (for example, water) to the center region of the upper surface of the substrate W.

As the low surface tension liquid, an organic solvent, besides IPA, that does not react chemically (is poor in reactivity) with the upper surface of the substrate W and the pattern (see FIG. 12) formed on the substrate W may be also used. More specifically, a liquid including at least one among IPA, HFE (hydrofluoroether), methanol, ethanol, acetone, and trans-1,2 dichloroethylene may be used as the low surface tension liquid. Also, the low surface tension liquid is not required to be constituted of just a single component and may be a liquid mixed with another component. For example, the low surface tension liquid may be a mixed liquid of an IPA liquid and pure water or a mixed liquid of an IPA liquid and an HFE liquid.

An inert gas such as nitrogen gas is supplied to the first inert gas nozzle 12 from an inert gas supply source, via a first inert gas supply pipe 59. The first inert gas supply pipe 59 has interposed therein a first inert gas valve 60 that opens and closes a flow passage thereof. The inert gas is not limited to nitrogen gas, and a gas that is inert with respect to the front surface of the substrate W and the pattern may be used as the inert gas. The inert gas may also be a rare gas, such as argon.

The processing unit 2 further includes a second inert gas nozzle 13 that supplies an inert gas such as nitrogen gas to the communicating hole 70b of the facing portion 70 of the shielding member 7. An inert gas is supplied to the second inert gas nozzle 13 from an inert gas supply source, via a second inert gas supply pipe 65. The second inert gas supply pipe 65 has interposed therein a second inert gas valve 66 that opens and closes a flow passage thereof. The second inert gas nozzle 13 is inserted through the rotating shaft 72 outside of the nozzle housing member 18.

The processing unit 2 further includes a hollow axis-shaped nozzle arm 31 that extends in the horizontal direction, an IPA nozzle 30 that is movable in the horizontal direction, is mounted integrally with the tip of the nozzle arm 31, has an interior space communicating with the interior space of the nozzle arm 31, and supplies IPA to the upper surface of the substrate W, and an IPA nozzle moving mechanism 32 that drives the nozzle arm 31 to move the IPA nozzle 30. The IPA nozzle 30 is an example of a processing liquid supply nozzle.

The IPA nozzle 30 extends in a direction crossing a central axis C2 of the nozzle arm 31. For the present preferred embodiment, the IPA nozzle 30 extends in a direction orthogonal to the central axis C2 of the nozzle arm 31. As an alternative to the present preferred embodiment, the IPA nozzle 30 may extend in a direction inclined with respect to both the direction orthogonal to the central axis C2 and the horizontal direction.

IPA is supplied to the interior space of the IPA nozzle 30 from an IPA supply source, via an IPA supply pipe 61. The IPA supply pipe 61 has interposed therein an IPA valve 62 that opens and closes a flow passage thereof.

Figure 3:
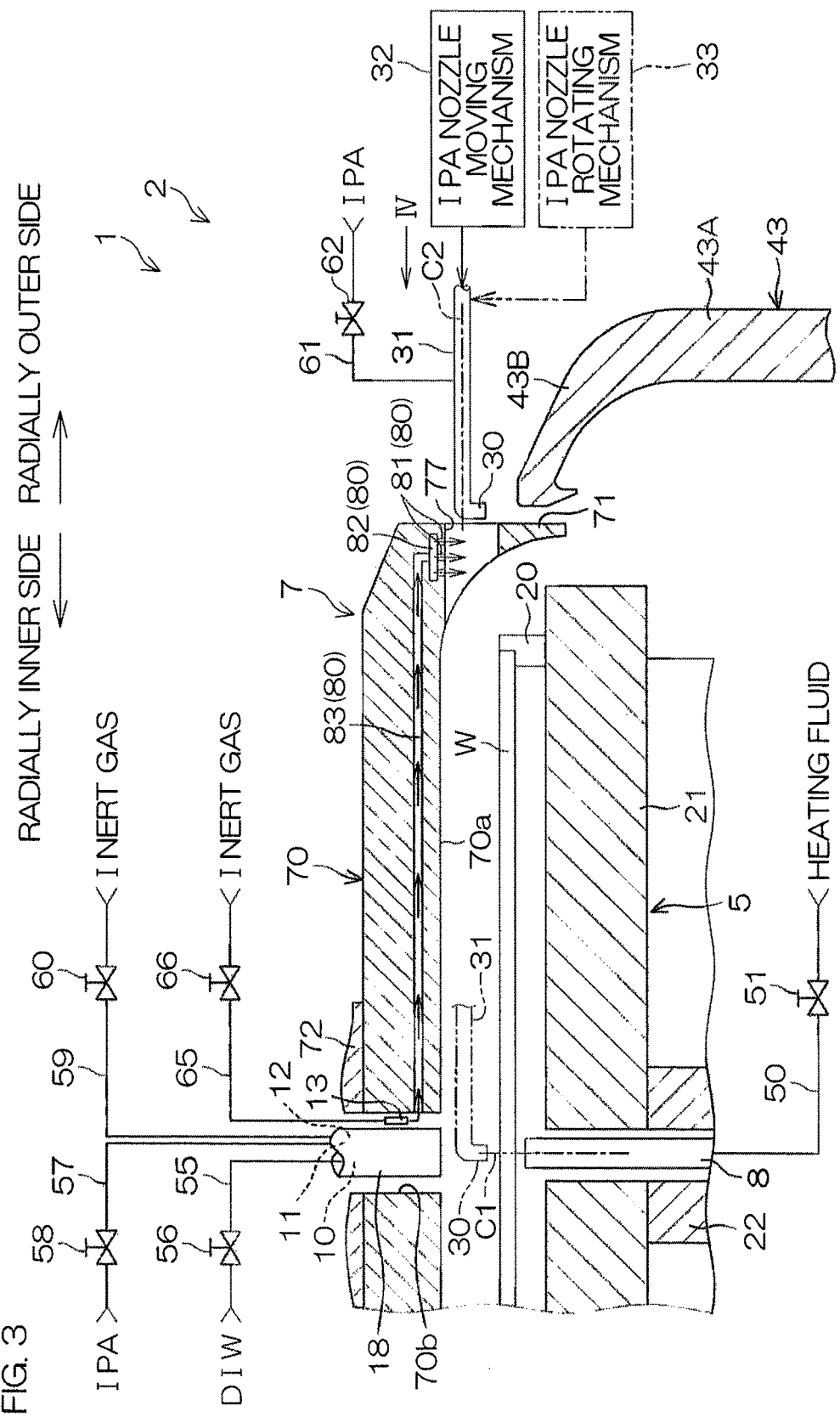
FIG. 3 is a schematic cross-sectional view of the vicinity of a shielding member provided in the processing unit.

The IPA nozzle moving mechanism 32 moves the nozzle arm 31 in the axial direction of the nozzle arm 31 to move the IPA nozzle 30 in the horizontal direction. The IPA nozzle moving mechanism 32 elevates and lowers the nozzle arm 31 along the vertical direction to move the IPA nozzle 30 vertically. By movement in the horizontal direction, the IPA nozzle 30 can move between a center position at which the IPA nozzle 30 faces the rotation center position of the upper surface of the substrate W, and a retracted position at which the IPA nozzle 30 does not face the upper surface of the substrate W and is separated (retracted) further toward the radially outer side than the annular portion 71 of the shielding member 7. In FIG. 3, the retracted position of the IPA nozzle 30 is indicated by a solid line.

The IPA nozzle moving mechanism 32 includes, for example, a first ball screw mechanism (not shown), a first electric motor (not shown) that applies driving force to the first ball screw mechanism for linear movement of the nozzle arm 31 in the direction in which the nozzle arm 31 extends, a second ball screw mechanism (not shown), and a second electric motor (not shown) that applies driving force to the second ball screw mechanism for elevating and lowering of the nozzle arm 31.

Figure 4:
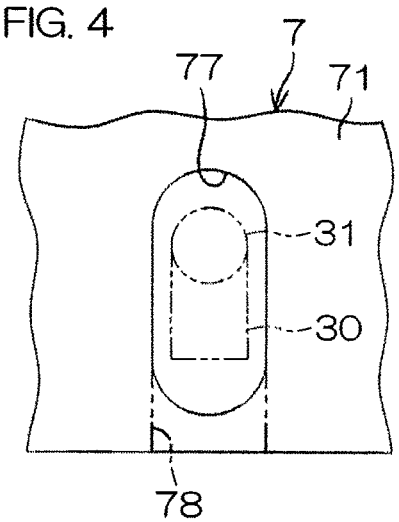
FIG. 4 is a diagram of an annular portion of the shielding member as viewed from the direction of the arrow IV in FIG. 3.

FIG. 3 is a schematic cross-sectional view of the vicinity of the shielding member 7. FIG. 4 is a diagram of the annular portion 71 of the shielding member 7 as viewed from the direction of the arrow IV in FIG. 3.

A penetrating hole 77 penetrating the annular portion 71 in the rotational radius direction of the substrate W, is formed in the shielding member 7. The penetrating hole 77 penetrates the inner peripheral surface and the outer peripheral surface of the annular portion 71. The inner peripheral surface of the annular portion 71 of the shielding member 7 is curved so as to go toward the radially outer side as it goes downward. The outer peripheral surface of the annular portion 71 of the shielding member 7 extends along the vertical direction. As shown in FIG. 4, the penetrating hole 77 has the form of a long hole that is long in the vertical direction, as viewed from the radially outer side.

The nozzle arm 31 and the IPA nozzle 30 facing downwardly can be inserted through the penetrating hole 77. When the penetrating hole 77 is positioned at upper side than the substrate W (for example, when the shielding member 7 is positioned at the second proximal position), the IPA nozzle 30 can move between the position further toward the rotational axis C1 side (the radially inner side) than the annular portion 71, and a position on the opposite side from the rotational axis C1 with respect to the annular portion 71 (the radially outer side), via the penetrating hole 77. That is, the penetrating hole 77 functions as a passage-allowing portion that is provided at the annular portion 71 and allows passage of the IPA nozzle 30 through the annular portion 71. In FIG. 3, the IPA nozzle 30 located at the center position which is a position further toward the radially inner side than the annular portion 71, and the nozzle arm 31 that supports the IPA nozzle 30 in that state, are indicated by alternate long and two short dashes lines.

As shown by the alternate long and two short dashes lines in FIG. 4, the passage-allowing portion may have the form of a notch 78 that is notched upward from the bottom end of the annular portion 71. The notch 78 has a shape in which, for example, the portion of the annular portion 71 between the penetrating hole 77 and the bottom end of the annular portion 71 has been removed, and relative movement between the annular portion 71 and the IPA nozzle 30 and nozzle arm 31 in the vertical direction allows the IPA nozzle 30 and nozzle arm 31 to enter the notch 78.

The processing unit 2 further includes an inert gas introducing mechanism 80 by which an inert gas supplied from the second inert gas nozzle 13 is introduced into the penetrating hole 77. The inert gas introducing mechanism 80 includes a plurality of inert gas discharge ports 81 that discharge the inert gas into the penetrating hole 77, an inert gas storage space 82 that communicates with the plurality of inert gas discharge ports 81 and stores the inert gas, and a connecting channel 83 that connects the communicating hole 70b formed in the facing portion 70 with the inert gas storage space 82. The inert gas discharge ports 81, inert gas storage space 82 and connecting channel 83 are formed in the shielding member 7.

In a state where the annular portion 71 is facing the substrate W from the horizontal direction, the inert gas is introduced into the penetrating hole 77 by the inert gas introducing mechanism 80, and it is thus suppressed that the processing liquid to be removed out from the substrate W passes through the annular portion 71 via the penetrating hole 77. The inert gas introducing mechanism 80 thus functions as a processing liquid passage suppressing unit.

The inert gas introducing mechanism 80 also introduces an inert gas into the penetrating hole 77, and a generation of airflow through the penetrating hole 77 can thus be suppressed. Thus, the inert gas introducing mechanism 80 functions also as an inflow/outflow suppressing unit that suppresses an inflow of outside gas into the space between the shielding member 7 and the upper surface of the substrate W, and an outflow of gas from the atmosphere between the shielding member 7 and the upper surface of the substrate W to outside.

Figure 5:
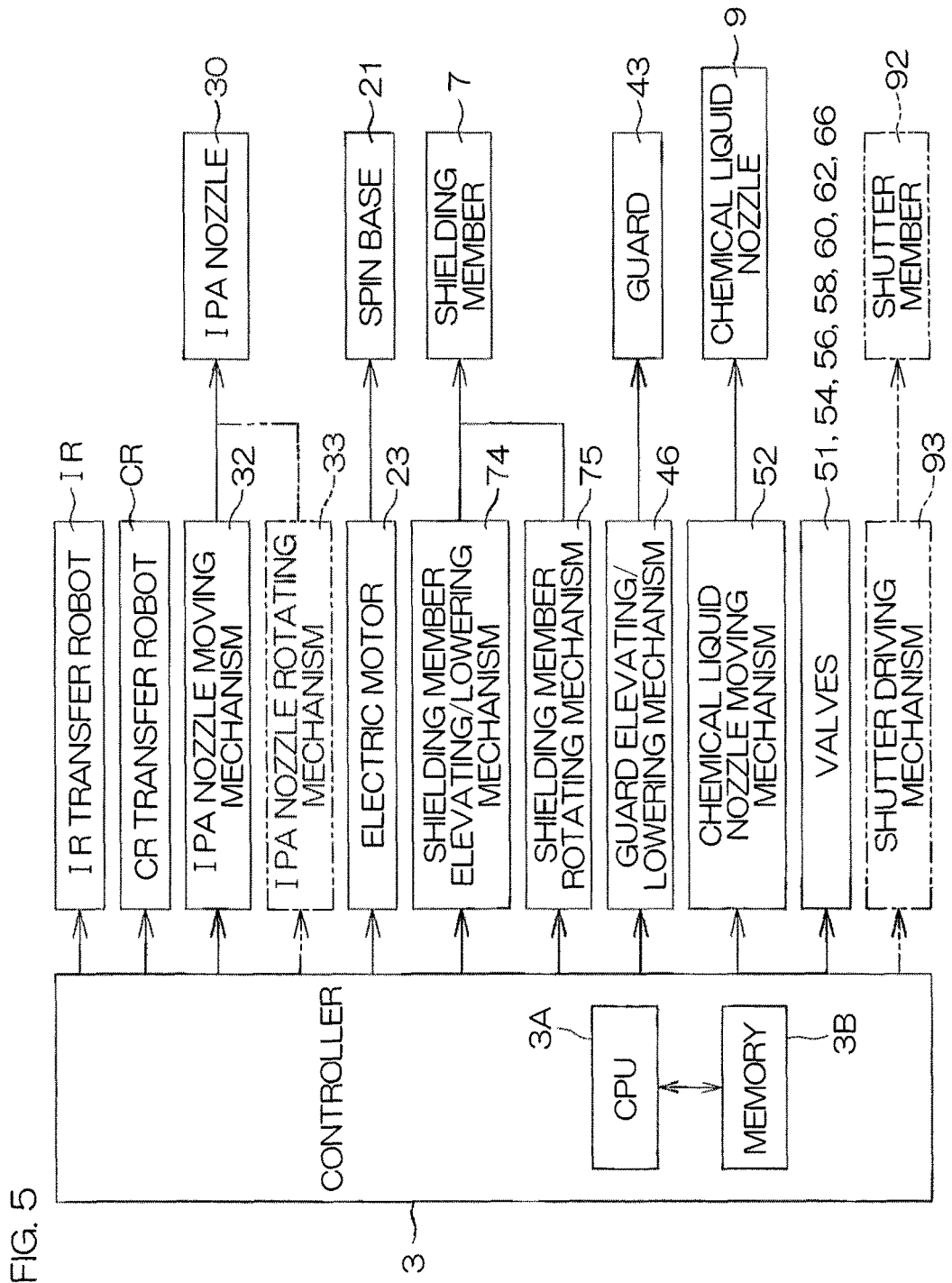
FIG. 5 is a block diagram for describing the electrical configuration of a main portion of the substrate processing apparatus.

FIG. 5 is a block diagram for describing the electrical configuration of a main portion of a substrate processing apparatus 1. The controller 3 has a microcomputer and controls control objects included in the substrate processing apparatus 1, according to a prescribed control program. More specifically, the controller 3 includes a processor (CPU) 3A and a memory 3B in which a control program has been stored, and the controller 3 is configured so as to execute various controls for the substrate processing by the processor 3A executing the control program. In particular, the controller 3 is programmed to control the transfer robots IR and CR, the IPA nozzle moving mechanism 32, the electric motor 23, the shielding member elevating/lowering mechanism 74, the shielding member rotating mechanism 75, the guard elevating/lowering mechanism 46, the chemical liquid nozzle moving mechanism 52 and the valves 51, 54, 56, 58, 60, 62 and 66, etc.

Figure 6:
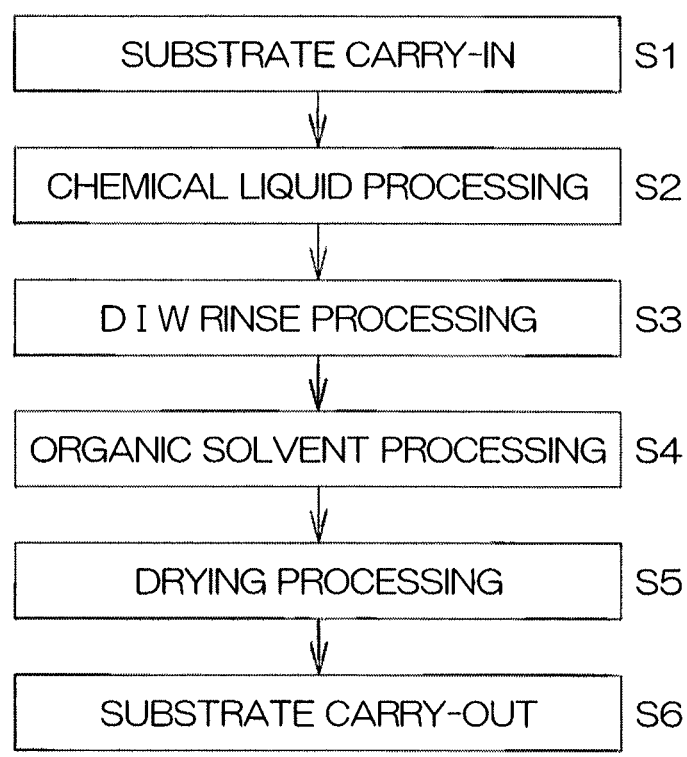
FIG. 6 is a flow diagram for describing an example of substrate processing performed by the substrate processing apparatus.

FIG. 6 is a flow diagram for describing an example of substrate processing performed by the substrate processing apparatus 1 and mainly shows the processing realized by the controller 3 executing an operation program. FIG. 7A to FIG. 7G are illustrative cross-sectional views of a main part of the processing unit 2 for describing states of the substrate processing.

In the substrate processing by the substrate processing apparatus 1, for example, carry-in of a substrate (S1), chemical liquid processing (S2), DIW rinse processing (S3), organic solvent processing (S4), drying processing (S5), and carry-out of the substrate (S6) are executed in that order as shown in FIG. 6.

First, in the substrate processing by the substrate processing apparatus 1, an unprocessed substrate W is carried from the carrier C into a processing unit 2 and transferred to the spin chuck 5 by the transfer robots IR and CR (S1). Thereafter, the substrate W is held horizontal by the spin chuck 5 until it is carried out by the transfer robot CR (substrate holding step).

Figure 7A:
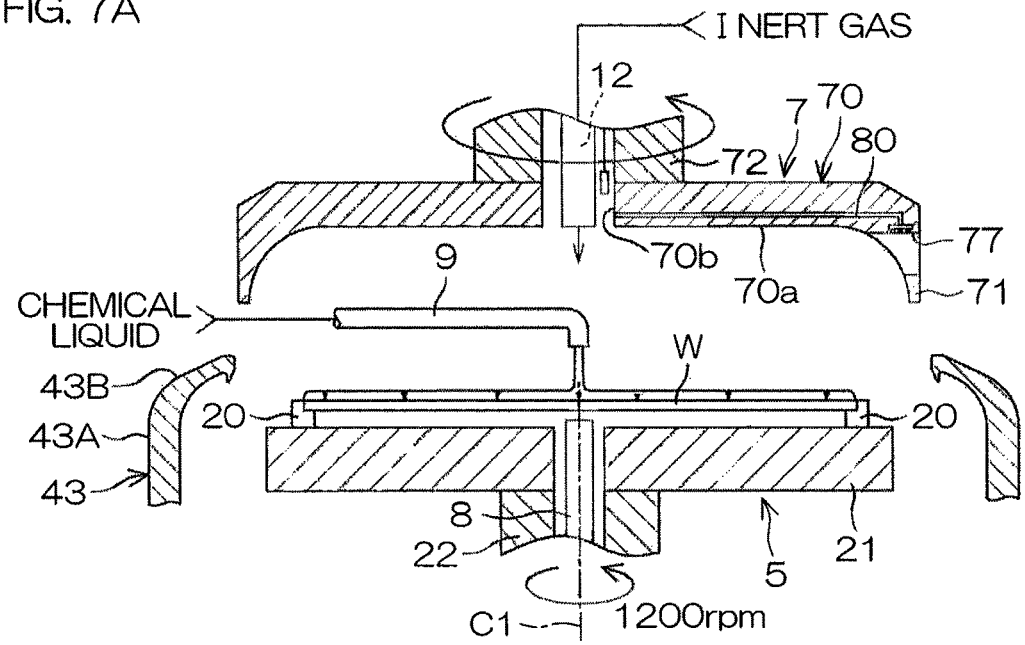
FIG. 7A to FIG. 7G are illustrative cross-sectional views of a main part of the processing unit for describing states of the substrate processing.

Next, with reference to FIG. 7A, the chemical liquid processing (S2) shall be described. After the transfer robot CR retracts out of the processing unit 2, the chemical liquid processing (S2) of cleaning the upper surface of the substrate W with the chemical liquid is executed.

Specifically, first the controller 3 opens the first inert gas valve 60 to supply inert gas (for example, nitrogen gas) from the first inert gas nozzle 12 onto the upper surface of the substrate W. The flow rate of the inert gas during this time is, for example, 10 liter/min or lower. As an alternative to the present preferred embodiment, the controller 3 may open the second inert gas valve 66 to supply inert gas (for example, nitrogen gas) from the second inert gas nozzle 13 onto the upper surface of the substrate W.

Then, the controller 3 controls the IPA nozzle moving mechanism 32 to position the IPA nozzle 30 at the retracted position. The controller 3 also controls the guard elevating/lowering mechanism 46 to dispose the guard 43 such that the upper end of the guard 43 is positioned at upper side than the upper surface of the substrate W.

Then, the controller 3 drives the electric motor 23 to rotate the spin base 21 at a prescribed chemical liquid speed. The chemical liquid speed is 1200 rpm, for example. The controller 3 may control the shielding member rotating mechanism 75 to rotate the shielding member 7. In this case, the shielding member 7 rotates in synchronization with the spin base 21. The phrase "rotates in synchronization" means that it rotates in the same direction at the same rotational speed. The controller 3 also controls the shielding member elevating/lowering mechanism 74 to dispose the shielding member 7 at the higher position. The controller 3 controls the chemical liquid nozzle moving mechanism 52 to dispose the chemical liquid nozzle 9 at a chemical liquid processing position above the substrate W.

The chemical liquid processing position may be a position at which the chemical liquid discharged from the chemical liquid nozzle 9 lands at the rotation center position of the upper surface of the substrate W. The controller 3 then opens the chemical liquid valve 54. The chemical liquid is thereby supplied from the chemical liquid nozzle 9 toward the upper surface of the substrate W in the rotating state. The supplied chemical liquid spreads across an entirety of the upper surface of the substrate W due to a centrifugal force.

The chemical liquid that has splashed outside the substrate due to centrifugal force passes under the extension portion 43B of the guard 43 and is received by the cylindrical portion 43A of the guard 43. The chemical liquid received by the cylindrical portion 43A flows to the cup 41 (see FIG. 2).

The DIW rinse processing (S3) shall now be described with reference to FIG. 7B and FIG. 7C.

After the chemical liquid processing (S2) of a fixed time, the DIW rinse processing (S3) for replacing the chemical liquid on the upper surface of the substrate W by the DIW to remove the chemical liquid from the substrate W is executed (step S3).

Figure 7B:
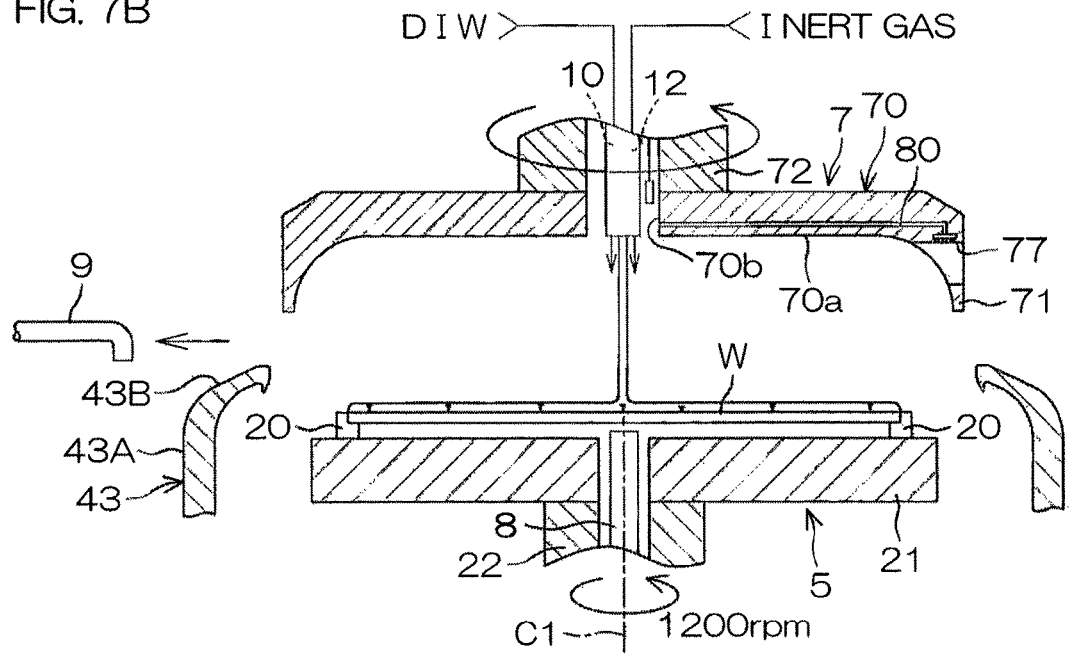

Specifically, referring to FIG. 7B, the controller 3 closes the chemical liquid valve 54, and controls the chemical liquid nozzle moving mechanism 52 to make the chemical liquid nozzle 9 retract from above the substrate W to the sides of the spin base 21 and guard 43.

The controller 3 also controls the guard elevating/lowering mechanism 46 to maintain a state where the guard 43 is disposed such that the upper end of the guard 43 is positioned at upper side than the upper surface of the substrate W.

The controller 3 then opens the DIW valve 56. DIW is thereby supplied from the DIW nozzle 10 toward the upper surface of the substrate W in the rotating state. The supplied DIW spreads across the entirety of the upper surface of the substrate W due to the centrifugal force. The chemical liquid on the substrate W is rinsed off by the DIW.

Supply of the inert gas by the first inert gas nozzle 12 and rotation of the substrate W by the spin base 21 are continued in the DIW rinse processing as well. The flow rate of the inert gas during the DIW rinse processing is, for example, 10 liter/min or lower.

The substrate W is rotated at a prescribed first DIW rinse speed. The first DIW rinse speed is 1200 rpm, for example. The controller 3 may also control the shielding member rotating mechanism 75 to rotate the shielding member 7. In this case, the shielding member 7 rotates in synchronization with the spin base 21. The controller 3 controls the shielding member elevating/lowering mechanism 74 to maintain a state with the shielding member 7 positioned at the higher position.

The chemical liquid and DIW that have splashed outside the substrate due to centrifugal force, pass under the extension portion 43B of the guard 43 and are received by the cylindrical portion 43A of the guard 43. The chemical liquid and DIW received by the cylindrical portion 43A flow to the cup 41 (see FIG. 2).

Figure 7C:
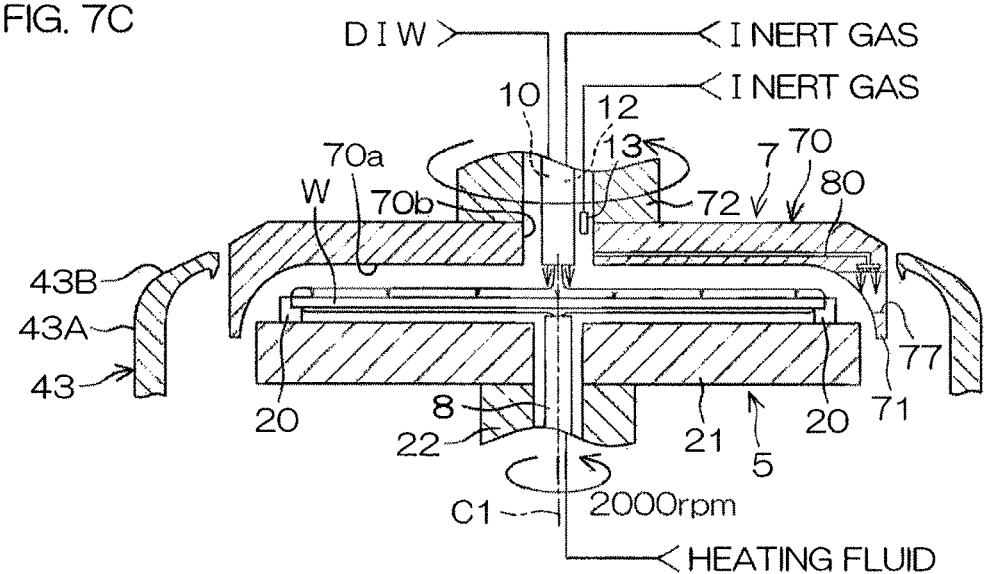

Referring to FIG. 7C, when the DIW is supplied from the DIW nozzle 10 toward the rotating upper surface of the substrate W, the controller 3 controls the shielding member elevating/lowering mechanism 74 to move the shielding member 7 from the higher position to the first proximal position. Also, the controller 3 controls the guard elevating/lowering mechanism 46 to maintain a state where the guard 43 is disposed such that the upper end of the guard 43 is positioned at upper side than the upper surface of the substrate W.

in a state where the shielding member 7 located in the first proximal position, or in other words, in a state where the atmosphere between the upper surface of the substrate W and the shielding member 7 shielded from the ambient atmosphere, an inert gas is supplied between the upper surface of the substrate W and the shielding member 7, from the first inert gas nozzle 12 (inert gas supplying step). Specifically, the controller 3 controls the first inert gas valve 60 to adjust the flow rate of the inert gas supplied from the first inert gas nozzle 12, to a prescribed replacement flow rate. The replacement flow rate is, for example, 100 liter/min to 300 liter/min. Replacement of the atmosphere between the upper surface of the substrate W and the shielding member 7, with the inert gas, is thereby started.

During this time, when supply of the inert gas from the second inert gas nozzle 13 has not yet been initiated, the controller 3 opens the second inert gas valve 66 to supply the inert gas from the second inert gas nozzle 13. The inert gas supplied from the second inert gas nozzle 13 is introduced into the penetrating hole 77 by the inert gas introducing mechanism 80.

The controller 3 controls the electric motor 23 to gradually accelerate rotation of the spin base 21 until the rotational speed of the spin base 21 reaches a prescribed second DIW rinse speed. The second DIW rinse speed is 2000 rpm, for example.

The controller 3 controls the shielding member rotating mechanism 75 to rotate the shielding member 7 (shielding member rotating step). During this time, the shielding member 7 rotates in synchronization with the spin base 21. By rotating the shielding member 7 in synchronization with the spin base 21, the inert gas more easily spreads out over the entire region between the upper surface of the substrate W and the shielding member 7. Replacement of the atmosphere between the upper surface of the substrate W and the shielding member 7, with the inert gas is thereby promoted.

The DIW that has splashed outside the substrate W due to centrifugal force is received by the annular portion 71 of the shielding member 7. The inert gas supplied from the second inert gas nozzle 13 is introduced into the penetrating hole 77 by the inert gas introducing mechanism 80, and it is thus suppressed that the DIW splashed out of the substrate W due to centrifugal force, passes through the annular portion 71 via the penetrating hole 77. During this time, if the extension portion 43B of the guard 43 is positioned at upper side than the penetrating hole 77 of the annular portion 71, then the DIW is received by the cylindrical portion 43A even when the DIW has flowed out in a small amount through the penetrating hole 77.

The organic solvent processing (S4) will now be explained with reference to FIG. 7D to FIG. 7F. After the DIW rinse processing (S3) for a fixed time period, organic solvent processing (S4) is executed, in which the DIW on the substrate W is replaced with an organic solvent (for example, IPA) as a low surface tension liquid, that has a lower surface tension than the rinse liquid (for example, water). The substrate W may also be heated during the organic solvent processing. Specifically, the controller 3 opens the heating fluid valve 51 to supply a heating fluid from the lower surface nozzle 8, and the substrate W is thereby heated.

Figure 7D:
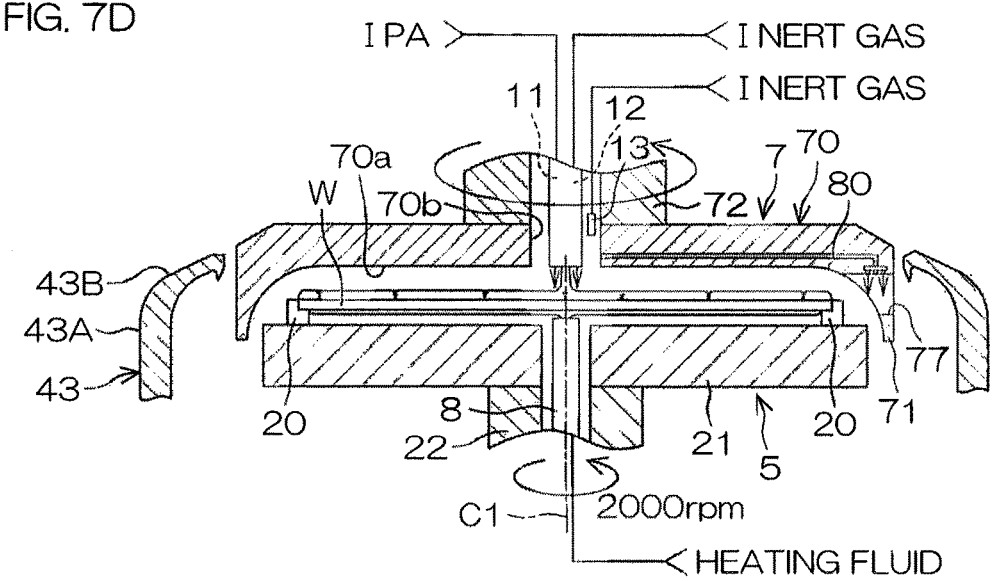

With reference to FIG. 7D, in the organic solvent processing, first, an IPA replacing step of replacing the DIW on the upper surface of the substrate W by IPA is executed.

The controller 3 closes the DIW valve 56. Supply of the DIW from the DIW nozzle 10 is thereby stopped. The controller 3 then opens the central IPA valve 58. The IPA is thereby supplied from the central IPA nozzle 11 toward the rotating upper surface of the substrate W. The IPA that has been supplied spreads throughout the entire upper surface of the substrate W due to centrifugal force, and the DIW on the substrate is replaced by the IPA. During the period in which the DIW on the substrate is replaced by IPA, the controller 3 drives the electric motor 23 to rotate the spin base 21 at a prescribed replacement speed. The replacement speed is 2000 rpm, for example.

The controller 3 controls the shielding member rotating mechanism 75 to rotate the shielding member 7 (shielding member rotating step). In this case, the shielding member 7 rotates in synchronization with the spin base 21. By rotating the shielding member 7 in synchronization with the spin base 21, the inert gas more easily spreads out over the entire region between the upper surface of the substrate W and the shielding member 7. Replacement of the atmosphere between the upper surface of the substrate W and the shielding member 7, with the inert gas, is thereby promoted.

The controller 3 controls the first inert gas valve 60 to maintain the flow rate of the inert gas supplied from the first inert gas nozzle 12, at the prescribed replacement flow rate. Replacement of the atmosphere between the upper surface of the substrate W and the shielding member 7 by inert gas, that has been initiated by the DIW rinse processing (S3), is completed in the IPA replacement step. Replacement of the atmosphere between the upper surface of the substrate W and the shielding member 7 by the inert gas is completed in about 20 seconds, for example.

The DIW and IPA that have splashed outside the substrate W due to centrifugal force is received by the annular portion 71 of the shielding member 7. The inert gas supplied from the second inert gas nozzle 13 is introduced into the penetrating hole 77 by the inert gas introducing mechanism 80, it is thus suppressed that the DIW and IPA that have splashed out of the substrate W due to centrifugal force passes through the annular portion 71 via the penetrating hole 77. During this time, if the extension portion 43B of the guard 43 is positioned at upper side than the penetrating hole 77 of the annular portion 71, then the DIW and IPA are received by the cylindrical portion 43A even when the DIW and IPA have flowed out in a small amount through the penetrating hole 77.

Figure 7E:
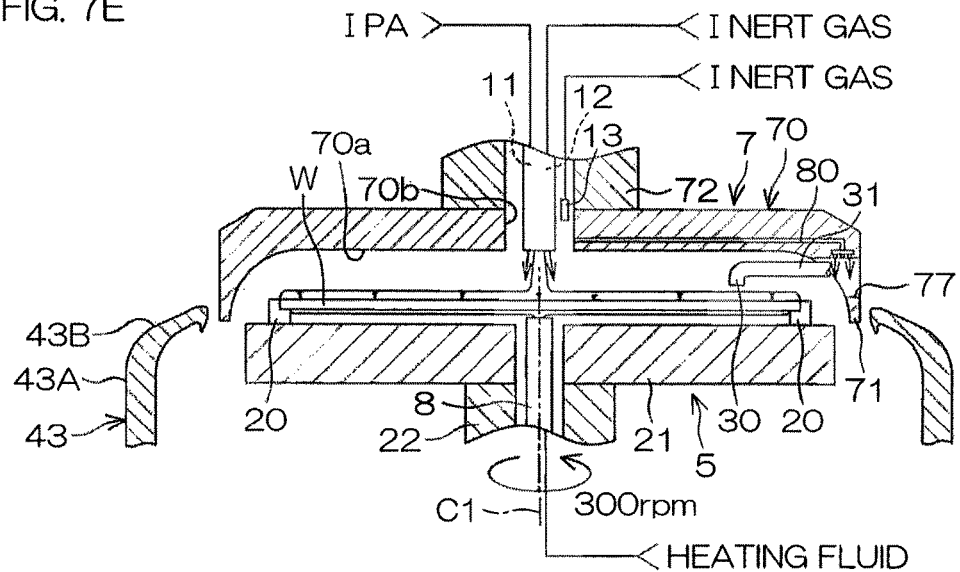

With reference to FIG. 7E, a liquid film forming step of forming a liquid film 110 of IPA is executed next in the organic solvent processing.

Continuing supply of the IPA to the upper surface of the substrate W forms a liquid film 110 of IPA on the upper surface of the substrate W. In order to form the liquid film 110 of IPA, the controller 3 controls the electric motor 23 to gradually decelerate rotation of the spin base 21 until the rotational speed reaches a prescribed liquid film forming speed. The liquid film forming speed is 300 rpm, for example.

The controller 3 also controls the shielding member rotating mechanism 75 to halt rotation of the shielding member 7. During this time, the controller 3 controls the shielding member rotating mechanism 75 to adjust the position of the penetrating hole 77 in the rotational direction, such that the IPA nozzle 30 can pass through the annular portion 71 via the penetrating hole 77 (position adjusting step). In other words, the controller 3 controls the shielding member rotating mechanism 75 such that rotation of the shielding member 7 stops in a state where the penetrating hole 77 faces the IPA nozzle 30 at the retracted position.

Then, during formation of the IPA liquid film 110 on the substrate W, the controller 3 controls the IPA nozzle moving mechanism 32 to move the IPA nozzle 30 via the penetrating hole 77 (nozzle moving step). Then, the IPA nozzle 30 moves from a position more toward the radially outer side than the annular portion 71 to a position more toward the radially inner side than the annular portion 71, and thereby becomes to position at a processing position. The processing position is a position of the IPA nozzle 30 shown in FIG. 7F, and is a position being slightly shifted (by about 30 mm, for example), from the center region of the upper surface of the substrate W to the peripheral edge side (the radially outer side) of the substrate W. The IPA nozzle 30 is capable of being moved between the facing surface 70a of the shielding member 7 and the upper surface of the substrate W when the shielding member 7 is positioned at least at a position higher than the second proximal position. The IPA nozzle 30 may also be capable of being moved between the facing surface 70a of the shielding member 7 and the upper surface of the substrate W when the shielding member 7 is positioned at the first proximal position.

Figure 7F:
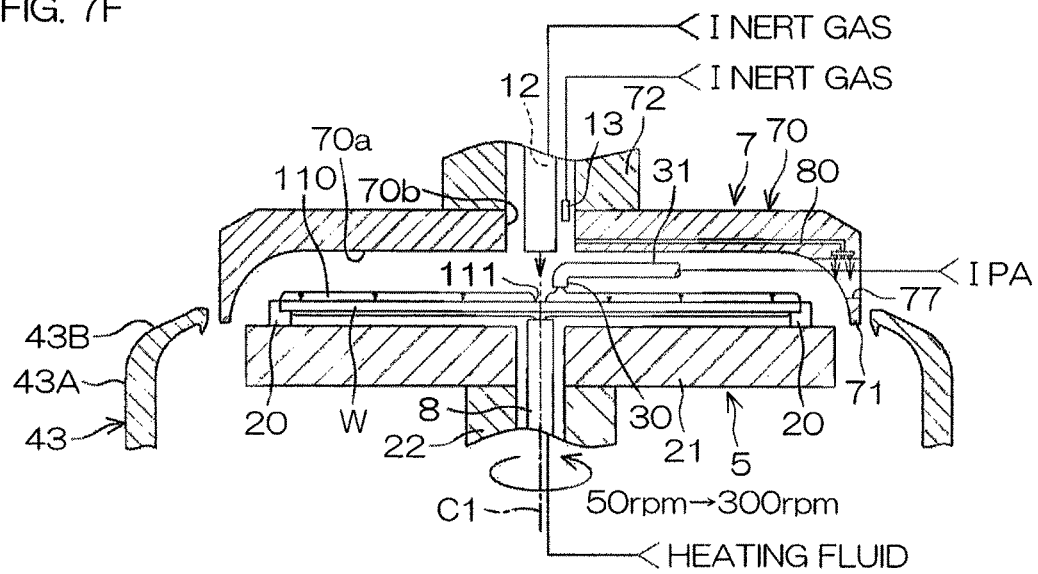

Referring to FIG. 7F, a liquid film removing step of removing the liquid film 110 of IPA from the upper surface of the substrate W is executed next in the organic solvent processing.

In the liquid film removing step, first, the controller 3 closes the central IPA valve 58 to interrupt supply of the IPA to the upper surface of the substrate W from the central IPA nozzle 11. The controller 3 then controls the first inert gas valve 60 to blow the inert gas perpendicularly toward the center region of the upper surface of the substrate W from the first inert gas nozzle 12 at, for example, 3 liter/min, and a small opening 111 (of approximately 30 mm diameter, for example) is thus opened in the center region of the liquid film 110, that exposes the center region of the upper surface of the substrate W.

In the liquid film removing step, it is not necessarily essential to form the opening 111 by blowing the inert gas. For example, the opening 111 may be formed in the center region of the liquid film 110 without blowing an inert gas, but by instead heating the substrate W by supply of a heating fluid from the lower surface nozzle 8 onto the center region of the lower surface of the substrate W, to evaporate the IPA in the center region. Alternatively, the opening 111 may be formed in the liquid film 110 by both blowing of the inert gas onto the upper surface of the substrate W and heating of the center region of the lower surface of the substrate W by a heating fluid. When the opening 111 is formed in the liquid film 110, the controller 3 may also control the electric motor 23 to decelerate the speed of the spin base 21 until the rotational speed of the spin base 21 reaches a prescribed opening formation speed. The opening formation speed is 50 rpm, for example.

The opening 111 is widened by centrifugal force that is due to rotation of the substrate W, and the IPA liquid film is removed from the upper surface of the substrate W. Blowing of the inert gas by the first inert gas nozzle 12 may be continued until the liquid film 110 is removed from the upper surface of the substrate W, or in other words, until the liquid film removing step has been completed. The blowing force of the inert gas causes force to be applied onto the IPA liquid film 110 and expansion of the opening 111 is thereby promoted.

When the opening 111 is expanded, the controller 3 controls the IPA valve 62 to initiate supply of IPA from the IPA nozzle 30 onto the upper surface of the substrate W. The temperature of the IPA supplied from the IPA nozzle 30 is preferably higher than room temperature, such as 50° C., for example. At this time, the controller 3 sets the liquid landing point of the IPA supplied from the IPA nozzle 30 to be the outside of the opening 111. The outside of the opening 111 is the opposite side of the rotational axis C1 with respect to the peripheral edge of the opening 111 (further toward the radially outer side of the opening 111).

As the opening 111 expands, the controller 3 controls the IPA nozzle moving mechanism 32 to move the IPA nozzle 30 toward the peripheral edge of the substrate W. Sufficient IPA is thereby supplied to the liquid film 110. It can thus be suppressed that the IPA further outward from the peripheral edge of the opening 111 disappears locally due to evaporation or centrifugal force. While the IPA nozzle 30 is passing through the annular portion 71 via the penetrating hole 77 and moving to a position more toward the opposite side of the rotational axis C1 than the annular portion 71, the controller 3 controls the shielding member rotating mechanism 75 to keep rotation of the shielding member 7 stopped.

The controller 3 controls the electric motor 23 to rotate the spin base 21 at a prescribed liquid film removal speed. The liquid film removal speed is 300 rpm, for example. The liquid film removal speed is not restricted to 300 rpm, and may be varied in the range of 300 rpm to 750 rpm.

In the liquid film removing step, rotation of the spin base 21 may be gradually accelerated, unlike in this substrate processing. For example, the liquid film removal speed may be varied in a stepwise manner in the range of 300 rpm to 1500 rpm.

As an alternative to the substrate processing described above, before the liquid landing position of the IPA supplied from the IPA nozzle 30 reaches an outer peripheral region of the upper surface of the substrate W, the spin base 21 is rotated at 300 rpm, and when the liquid landing position of the IPA supplied from the IPA nozzle 30 reaches the outer peripheral region, the rotation of the spin base 21 may be accelerated in a stepwise manner. During this time, when the liquid landing position of the IPA supplied from the IPA nozzle 30 reaches the outer peripheral region, the controller 3 closes the first inert gas valve 60 to stop supply of the IPA from the IPA nozzle 30. The liquid landing position is a position where the IPA liquid lands on the upper surface of the substrate W. The outer peripheral region of the upper surface of the substrate W is a region near the peripheral edge of the upper surface of the substrate W. Also, stepwise rotation of the spin base 21 is accelerated to 500 rpm and maintained for a prescribed time (for example, 2 sec), after which it is accelerated to 750 rpm and maintained for a prescribed time (for example, 2 sec) and subsequently accelerated to 1500 rpm.

By accelerating rotation of the spin base 21 when the liquid landing position of the IPA has reached the outer peripheral region of the upper surface of the substrate W, it is possible to reliably remove the liquid film 110 in the outer peripheral region from above the substrate W. In addition, by stopping supply of the IPA from the IPA nozzle 30 to the outer peripheral region of the upper surface of the substrate W, it is possible to prevent the IPA from splashing back from the chuck pins 20. It can thereby be prevent that the IPA adheres onto the upper surface of the substrate W or shielding member 7 that has been exposed on the inside of the opening 111. The inside of the opening 111 is the rotational axis C1 side with respect to the peripheral edge of the opening 111 (further toward the radially inner side of the opening 111).

Figure 7G:
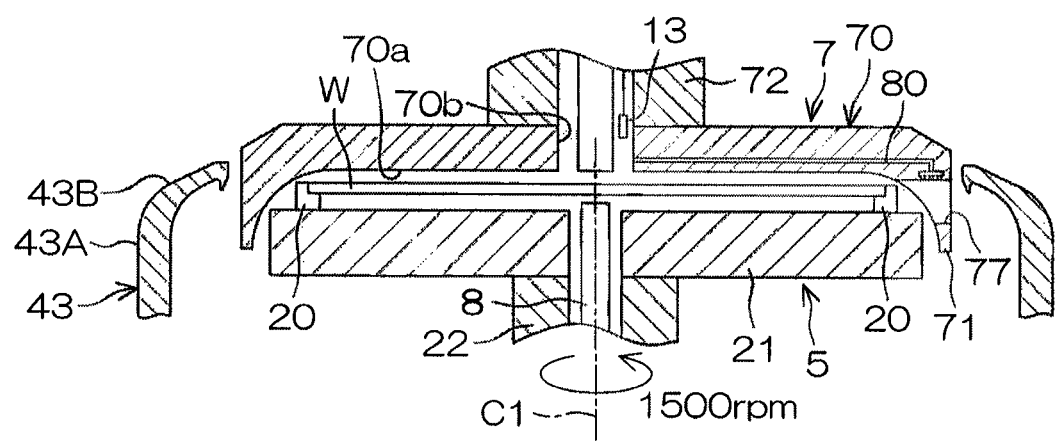

Next, the drying processing (S5) shall be described with reference to FIG. 7G. After the organic solvent processing (S4) ends, the drying processing (S5: spin drying) for spinning off the liquid component on the upper surface of the substrate W by the centrifugal force is executed.

Specifically, the controller 3 closes the heating fluid valve 51, the IPA valve 62, the first inert gas valve 60 and the second inert gas valve 66, and controls the IPA nozzle moving mechanism 32 to retract the IPA nozzle 30 to the retracted position. The controller 3 also controls the shielding member elevating/lowering mechanism 74 to dispose the shielding member 7 at the lower position.

The controller 3 also controls the electric motor 23 to cause high-speed rotation of the substrate W at the drying speed. The drying speed is 1500 rpm, for example. The liquid component on the substrate W is thereby spun off by centrifugal force. The controller 3 controls the shielding member rotating mechanism 75 to rotate the shielding member 7. During this process, the shielding member 7 undergoes synchronous rotation with the spin base 21. The processing liquid that has adhered to the facing portion 70 and annular portion 71 of the shielding member 7 is thereby removed.

Thereafter, the controller 3 controls the electric motor 23 to stop rotation of the spin chuck 5, and controls the shielding member rotating mechanism 75 to stop rotation of the shielding member 7. The controller 3 also controls the shielding member elevating/lowering mechanism 74 to retract the shielding member 7 to the higher position.

Thereafter, the transfer robot CR enters into the processing unit 2, lifts up the processed substrate W from the spin chuck 5, and carries it out of the processing unit 2 (S6). The substrate W is transferred from the transfer robot CR to the transfer robot IR and is housed in a carrier C by the transfer robot IR.

According to the present preferred embodiment, the shielding member 7 shields the atmosphere between the shielding member 7 and the upper surface of the substrate W from the ambient atmosphere. In this state, the inert gas is supplied to the space between the shielding member 7 and the upper surface of the substrate W, from the first inert gas nozzle 12. Since the shielding member 7 includes the annular portion 71 that surrounds the substrate W, the space between the shielding member 7 and the upper surface of the substrate W is enclosed, and therefore the atmosphere in the space is efficiently replaced by the inert gas. The oxygen concentration and humidity in the atmosphere between the shielding member 7 and the upper surface of the substrate W is thereby reduced.

The shielding member 7 is rotated by the shielding member rotating mechanism 75, and the position of the penetrating hole 77 of the annular portion 71, in the rotational direction is thereby changed. Then, the controller 3 controls the shielding member rotating mechanism 75 to adjust the position of the penetrating hole 77 in the rotational direction, and rotation of the shielding member 7 is thereby stopped such that the penetrating hole 77 faces the IPA nozzle 30 that is positioned at the retracted position. The IPA nozzle 30 can thereby moves in the horizontal direction to pass through the annular portion 71 of the shielding member 7 via the penetrating hole 77. Therefore, the processing liquid can be supplied from the IPA nozzle 30 to the substrate W, in a state where oxygen concentration and humidity in the atmosphere between the upper surface of the substrate W and the shielding member 7, is reduced.

In addition, the IPA nozzle 30 moves between the position further toward the rotational axis C1 side (the radially inner side) than the annular portion 71, and a position on the opposite side of the rotational axis C1 with respect to the annular portion 71 (the radially outer side), via the penetrating hole 77. Consequently, the processing liquid can be supplied from the IPA nozzle 30 onto the upper surface of the substrate W, in a state where oxygen concentration and humidity in the atmosphere between the upper surface of the substrate W and the shielding member 7, is reduced. It is particularly preferred that the IPA nozzle 30 supplies the IPA to the rotation center position on the upper surface of the substrate W. The processing liquid is thereby easy to spread over the entire upper surface of the substrate W.

Moreover, the simple penetrating hole 77 allows the IPA nozzle 30 to pass through the annular portion 71. Also, if the penetrating hole 77 is provided with a sufficient size necessary for insertion of the IPA nozzle 30, it is possible to suppress the inflow of external gas into the space between the upper surface of the substrate W and the shielding member 7, and the outflow of the gas from the atmosphere between the upper surface of the substrate W and the shielding member 7 to outside. Increasing in the oxygen concentration and humidity of the atmosphere between the upper surface of the substrate W and the shielding member 7, can thus be suppressed.

Furthermore, an arrangement wherein the passage-allowing portion is a notch 78 allows the IPA nozzle 30 to pass through the annular portion 71 via the notch 78. Also, the shielding member 7 is elevated and lowered by the shielding member elevating/lowering mechanism 74, and the IPA nozzle 30 and nozzle arm 31 can thereby enter into the notch 78 from below. Consequently, when the shielding member 7 is positioned at a position away from the upper surface of the substrate W (for example, a higher position), the shielding member 7 can be moved to the second proximal position in a state where the IPA nozzle 30 is introduced beforehand to near the center position. The substrate processing time can thus be shortened.

Moreover, the inert gas introducing mechanism 80 suppresses passage of the processing liquid that is removed out from the substrate W, through the annular portion 71 via the penetrating hole 77. Thus, it is allowed that the IPA nozzle 30 passes through the annular portion 71, and it is effectively suppressed that the processing liquid removed out from the substrate W, passes the annular portion 71 and leaks out to the outside.

Figure 8A:
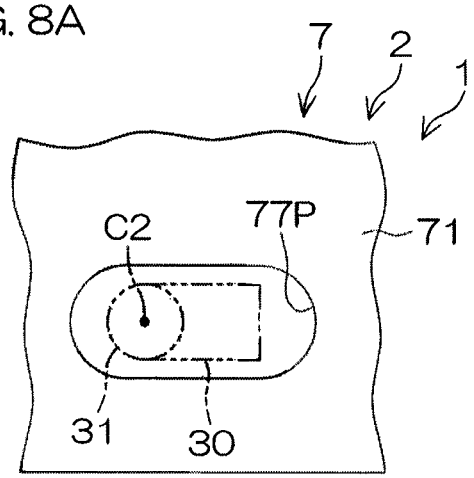
FIG. 8A is a diagram showing the vicinity of a passage-allowing portion of a shielding member according to a first modification example of the first preferred embodiment.
Figure 8B:
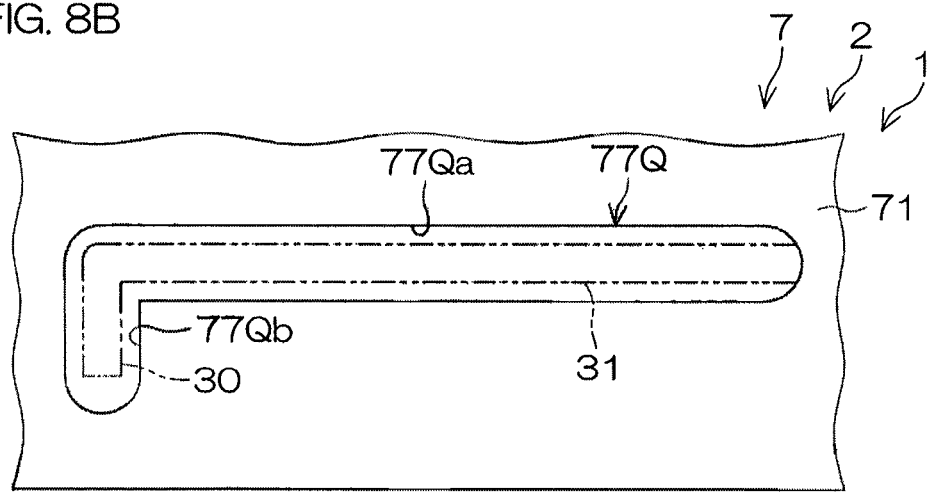
FIG. 8B is a diagram showing the vicinity of a passage-allowing portion of a shielding member according to a second modification example of the first preferred embodiment.

The processing unit 2 of the substrate processing apparatus 1 according to a first modification example and second modification example of the first preferred embodiment will now be described. FIG. 8A is a diagram showing the vicinity of a penetrating hole 77P of the shielding member 7 according to the first modification example of the first preferred embodiment. FIG. 8B is a diagram showing the vicinity of a penetrating hole 77Q of the shielding member 7 according to the second modification example of the first preferred embodiment. In FIG. 8A and FIG. 8B, the same members as those explained above are indicated by like reference symbols, and their explanation will be omitted.

Referring to FIG. 8A, the penetrating hole 77P of the shielding member 7 according to the first modification example has the form of a long hole that is long in the horizontal direction and penetrates through the annular portion 71. The processing unit 2 according to the first modification example further includes an IPA nozzle rotating mechanism 33 that drives the nozzle arm 31 to rotate the IPA nozzle 30 around the central axis C2 of the nozzle arm 31 (see alternate long and two short dashes lines in FIG. 3). The IPA nozzle rotating mechanism 33 is an example of a nozzle rotating unit that rotates the processing liquid supply nozzle around the central axis C2. The IPA nozzle rotating mechanism 33 includes an electric motor (not shown) that rotates the nozzle arm 31 around the central axis C2.

The controller 3 controls the IPA nozzle rotating mechanism 33 (see FIG. 2) to rotate the nozzle arm 31 around the central axis C2 such that the direction in which the IPA nozzle 30 extends coincides with the horizontal direction. The nozzle arm 31 and the IPA nozzle 30 facing the horizontal direction can thereby be inserted through the penetrating hole 77P. The IPA nozzle 30 is capable of moving between the position further toward the rotational axis C1 side (the radially inner side) than the annular portion 71, and a position on the opposite side of the rotational axis C1 with respect to the annular portion 71 (the radially outer side), via the penetrating hole 77P. That is, the penetrating hole 77P is provided at the annular portion 71, and functions as a passage-allowing portion to allow passage of the IPA nozzle 30 through the annular portion 71.

According to this modification example, the IPA nozzle 30 is supported by the nozzle arm 31 extending in the horizontal direction, and extends in a direction crossing the central axis C2 of the nozzle arm 31. The IPA nozzle 30 is rotated around the central axis C2 by the IPA nozzle rotating mechanism 33, and can thereby pass through the annular portion 71 via the penetrating hole 77P that is long in the horizontal direction and penetrates through the annular portion 71. Since the penetrating hole 77P is long in the horizontal direction, it is possible to reduce the dimensions of the annular portion 71 in the vertical direction, in comparison with an arrangement in which the penetrating hole 77P is long in a direction other than the horizontal direction. The space between the upper surface of the substrate W and the shielding member 7 is thereby narrowed, and therefore the oxygen concentration and humidity in the atmosphere between the upper surface of the substrate W and the shielding member 7, can be rapidly reduced.

Referring to FIG. 8B, the penetrating hole 77Q of the shielding member 7 according to the second modification example has a form including a first hole 77Qa that is long in the horizontal direction, and a second hole 77Qb that extends in the vertical direction (downward) from one end of the first hole 77Qa in the horizontal direction.

In this case, the IPA nozzle moving mechanism 32 includes, for example, a pivoting shaft that is connected to the nozzle arm 31 and extends in the vertical direction, a first electric motor (not shown) that applies driving force to the pivoting shaft around the pivoting shaft axis to move the nozzle arm 31 horizontally, a ball screw mechanism (not shown), and a second electric motor (not shown) that applies driving force to the ball screw mechanism to elevate and lower the pivoting shaft to which the nozzle arm 31 is connected.

According to this modification example, even with an arrangement in which the nozzle arm 31 revolves around the vertical pivoting shaft axis by the IPA nozzle moving mechanism 32 (see FIG. 2), it is possible for the nozzle arm 31 to pass through the annular portion 71 via the first hole 77Qa, and for the IPA nozzle 30 to pass through the annular portion 71 via the second hole 77Qb. That is, the penetrating hole 77Q is provided at the annular portion 71, and functions as a passage-allowing portion to allow passage of the IPA nozzle 30 through the annular portion 71.

Figure 9:
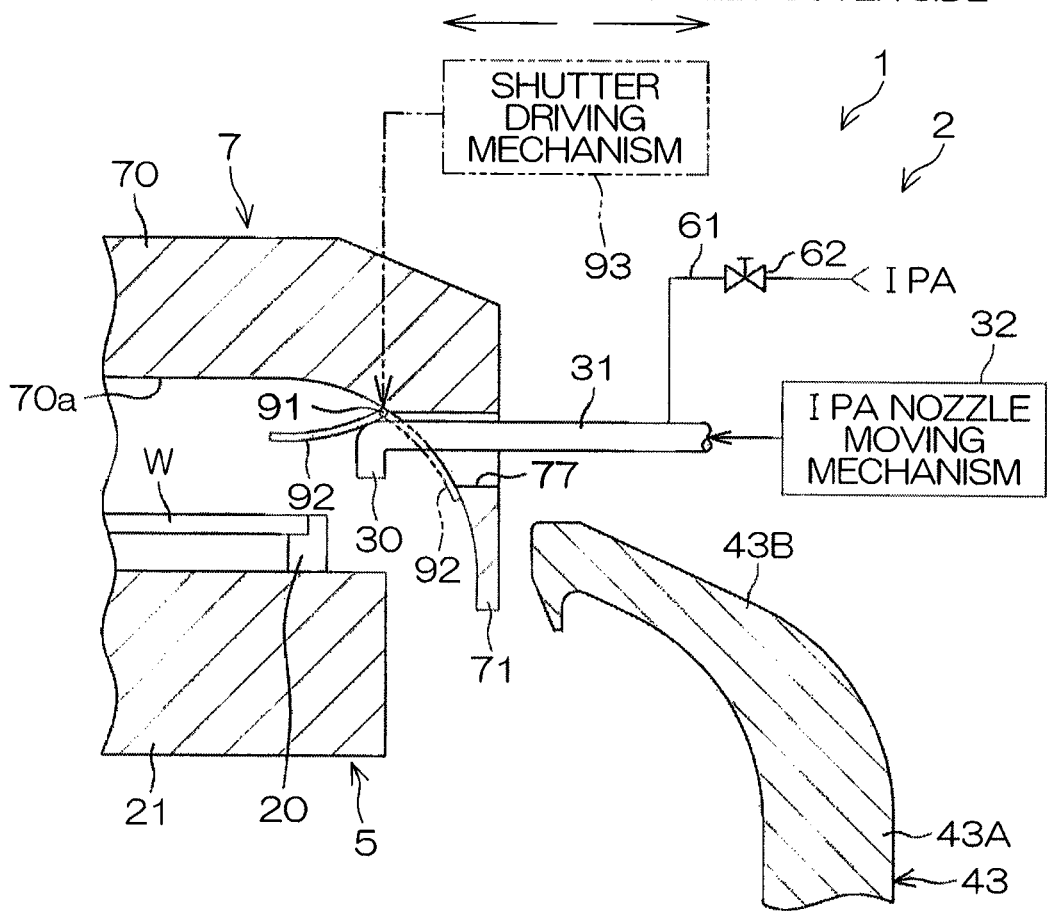
FIG. 9 is a schematic cross-sectional view of the vicinity of a shielding member according to a third modification example of the first preferred embodiment.

The processing unit 2 of the substrate processing apparatus 1 according to a third modification example of the first preferred embodiment will now be described. FIG. 9 is a schematic cross-sectional view of the vicinity of the shielding member 7 according to the third modification example of the first preferred embodiment. In FIG. 9, the same members as those explained above are indicated by like reference symbols, and their explanation will be omitted.

The processing unit 2 according to the third modification example includes a rotational center shaft 91 extending in a straight linear manner in the horizontal direction, and a shutter member 92 that is coupled with the rotational center shaft 91 in a rotatable manner around the rotational center shaft 91 and shuts the penetrating hole 77 from the radially inner side. In other words, the shutter member 92 is hinge-coupled with the radially inner side end of the penetrating hole 77. The shutter member 92 has the form of a thin resin, for example. The shutter member 92 may also have the form of a belt-shaped rubber strip. The shutter member 92 has, for example, a bent shape so as to follow the inner peripheral surface of the annular portion 71 in a state where the shutter member shuts the penetrating hole 77.

When the IPA nozzle 30 moves in the penetrating hole 77 toward the radially inner side, the IPA nozzle 30 contacts the shutter member 92 and rotates the shutter member 92 around the rotational center shaft 91 to push back the shutter member 92, and can thereby pass through the annular portion 71. Conversely, when the IPA nozzle 30 moves in the penetrating hole 77 toward the radially outer side, the shutter member 92 is released from being pushed back by the IPA nozzle 30, and thus the shutter member 92 rotates around the rotational center shaft 91 by its own weight and moves down the rotational center shaft 91.

Also, when the shielding member 7 is in the rotational state, the shutter member 92 is pushed back to the inner peripheral surface of the annular portion 71 by centrifugal force. The radially inner side end of the penetrating hole 77 is thereby shut by the shutter member 92. Consequently, the shutter member 92 suppresses that the processing liquid, removed out from the substrate W, passes through the annular portion 71 via the penetrating hole 77. The shutter member 92 thus functions as a processing liquid passage suppressing unit.

In addition, since the shutter member 92 shuts the penetrating hole 77 during rotation of the shielding member 7, generation of airflow passing through the penetrating hole 77, can be suppressed. Thus, the inert gas introducing mechanism 80 functions also as an inflow/outflow suppressing unit that suppresses the inflow of outside gas into the space between the shielding member 7 and the upper surface of the substrate W, and the outflow of gas from the atmosphere that is between the shielding member 7 and the upper surface of the substrate W to outside.

The arrangement may also be such that the shutter member 92 is not pushed against the inner peripheral surface of the annular portion 71 by centrifugal force. That is, the shutter member 92 does not need to completely shut the radially inner side end of the penetrating hole 77, and need only be disposed so as to block the pathway of the processing liquid removed off from the substrate W toward the penetrating hole 77.

Also, as an alternative to the third modification example, the processing unit 2 may include a shutter driving mechanism 93 (see alternate long and two short dashes lines) that rotates the shutter member 92 around the rotational center shaft 91 to shut the penetrating hole 77 or open the penetrating hole 77. The shutter driving mechanism 93 includes, for example, an electric motor that applies driving force to the shutter member 92 around the rotational center shaft 91. The shutter driving mechanism 93 is controlled by the controller 3 (see alternate long and two short dashes lines in FIG. 5).

Second Preferred Embodiment

Figure 10A:
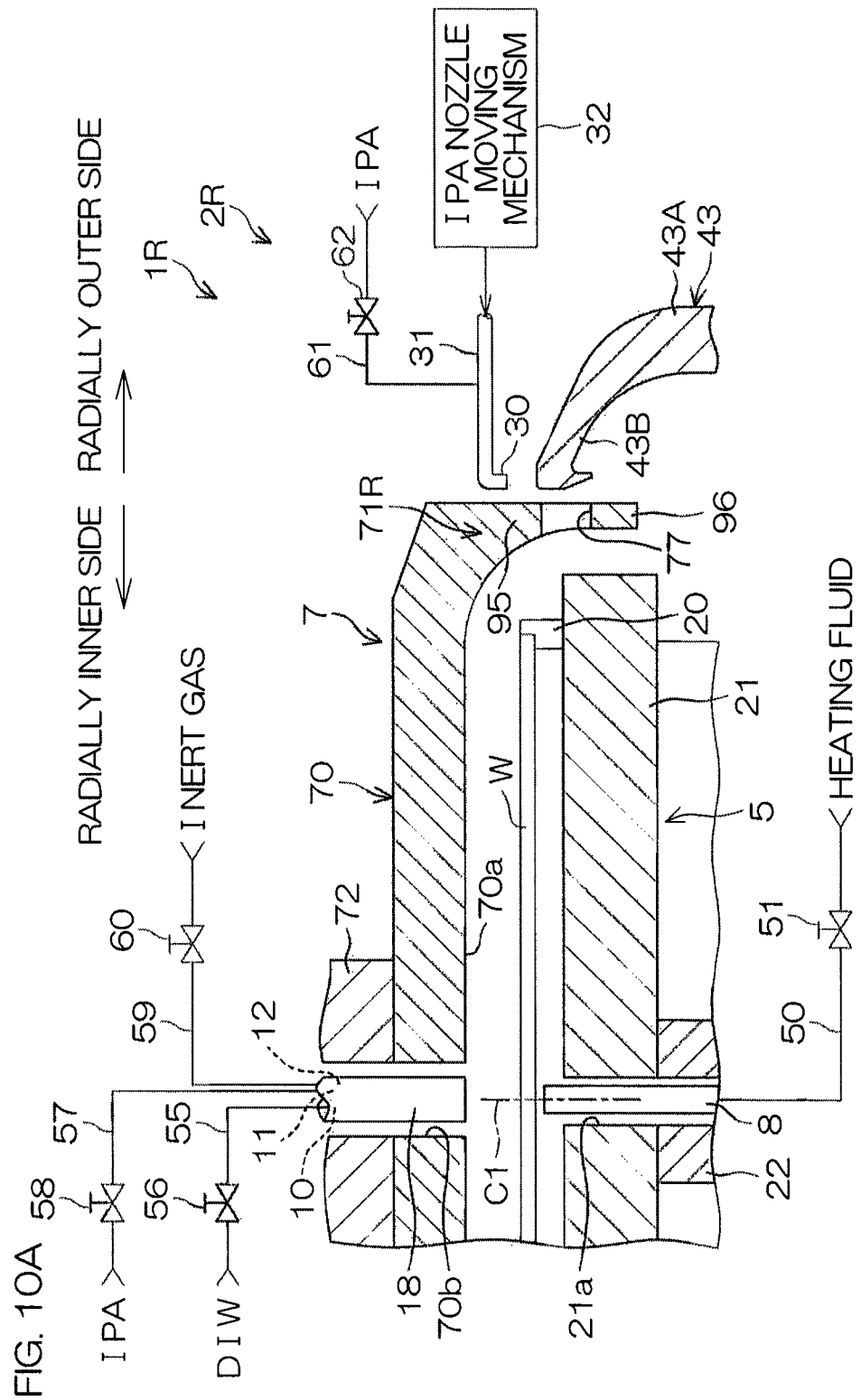
FIG. 10A and FIG. 10B are schematic cross-sectional views of the vicinity of a shielding member provided in a processing unit according to a second preferred embodiment of the present invention.
Figure 10B:
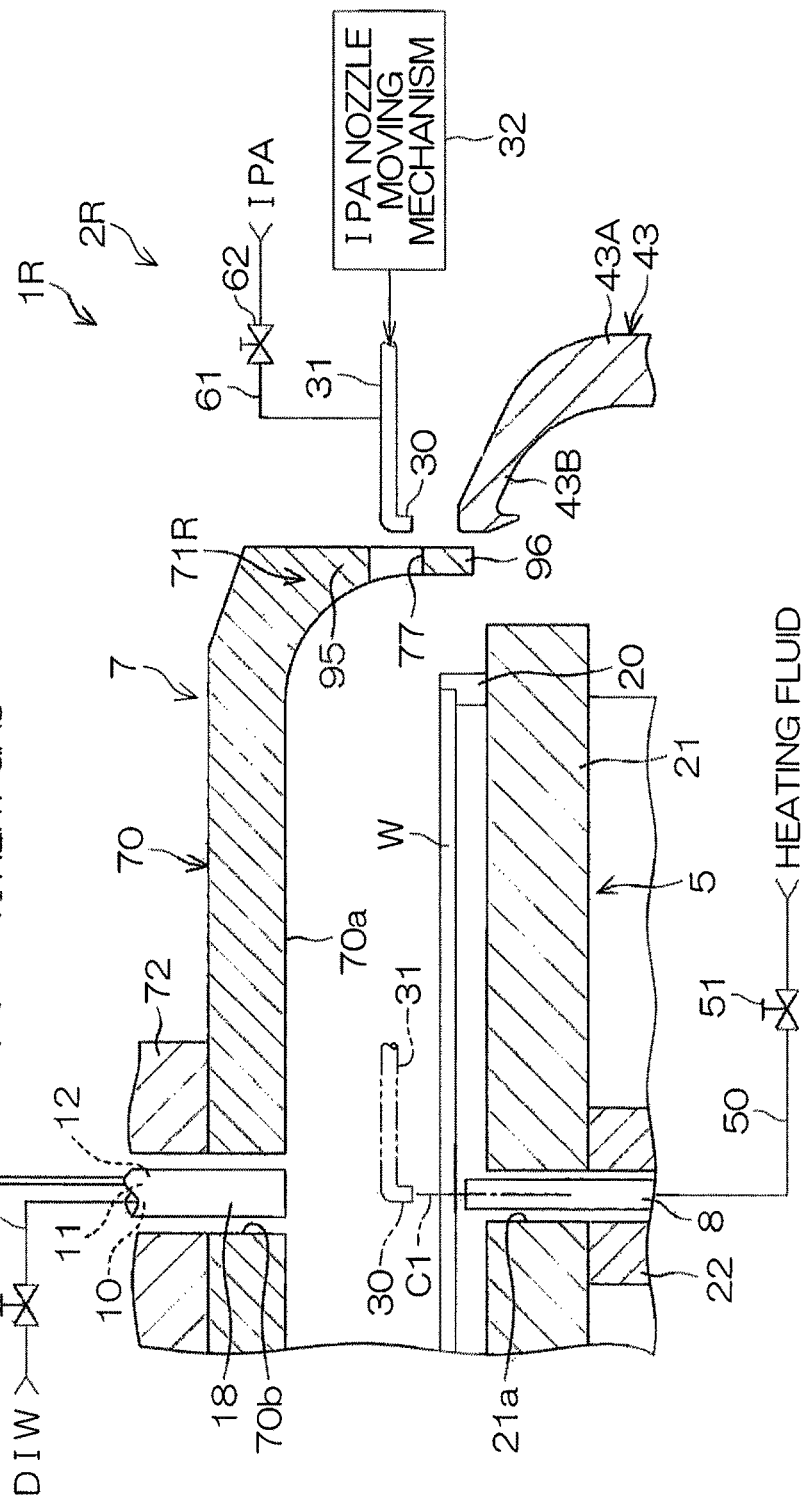

A processing unit 2R of a substrate processing apparatus 1R according to a second preferred embodiment of the present invention will now be described. FIG. 10A and FIG. 10B are schematic cross-sectional views of the vicinity of a shielding member 7 provided in the processing unit 2R according to the second preferred embodiment. In FIG. 10A and FIG. 10B, the same members as those explained above are indicated by like reference symbols, and their explanation will be omitted.

The main point of difference of the shielding member 7 of the second preferred embodiment compared to the shielding member 7 of the first preferred embodiment (see FIG. 3) is that an annular portion 71R of the shielding member 7 of the second preferred embodiment further includes a liquid receiver 95 that receives processing liquid removed off from the substrate W, and is provided at upper side than the penetrating hole 77. Stated differently, the annular portion 71R includes an annular liquid receiver 95 without a hole over the entire periphery in the circumferential direction, and an annular penetrating hole-forming portion 96 with a penetrating hole 77 formed therein, that is disposed below the liquid receiver 95. The liquid receiver 95 and the penetrating hole-forming portion 96 are formed in an integral manner. The annular portion 71R extends to a lower position than the annular portion 71 of the first preferred embodiment (see FIG. 3).

The annular portion 71R faces the substrate W from the horizontal direction in a state where the shielding member 7 located at a third proximal position (the position shown in FIG. 10A) and a fourth proximal position (the position shown in FIG. 10B) between the lower position and the higher position. When the annular portion 71R is facing the substrate W from the horizontal direction, the atmosphere between the shielding member 7 and the upper surface of the substrate W is shielded from the ambient atmosphere.

Referring to FIG. 10A, when the shielding member 7 is positioned at the third proximal position, the liquid receiver 95 faces the substrate W from the horizontal direction, and the penetrating hole-forming portion 96 is positioned lower than the substrate W. Therefore, when the shielding member 7 is positioned at the third proximal position, the IPA nozzle 30 is unable to pass through the annular portion 71R via the penetrating hole 77. Moreover, when the shielding member 7 is positioned at the third proximal position, the processing liquid that has been removed off from the substrate W is received by the liquid receiver 95, thereby preventing the processing liquid from flying further toward the radially outer side than the shielding member 7.

Referring to FIG. 10B, on the other hand, when the shielding member 7 is positioned at the fourth proximal position, the penetrating hole-forming portion 96 faces the substrate W from the horizontal direction, and the penetrating hole 77 is positioned at a slightly upper side than the upper surface of the substrate W. Therefore, when the shielding member 7 is positioned at the fourth proximal position, the IPA nozzle 30 is able to pass through the annular portion 71R via the penetrating hole 77.

For the present preferred embodiment, in the DIW rinse processing (S3) and organic solvent processing (S4), the controller 3 controls the shielding member elevating/lowering mechanism 74 to position the shielding member 7 at the third proximal position, instead of positioning the shielding member 7 at the first proximal position (see FIG. 7C and FIG. 7D). Also, in the DIW rinse processing (S3) and organic solvent processing (S4), the controller 3 controls the shielding member elevating/lowering mechanism 74 to position the shielding member 7 at the fourth proximal position, instead of positioning the shielding member 7 at the second proximal position (see FIG. 7E and FIG. 7F).

According to the present preferred embodiment, elevating and lowering the shielding member 7 by the shielding member elevating/lowering mechanism 74 makes it possible to switch the location of the shielding member 7 in the vertical direction, to the location where the penetrating hole 77 is positioned at upper side than the upper surface of the substrate W (see FIG. 10B), and to the location where penetrating hole 77 is positioned at lower side than the upper surface of the substrate W (see FIG. 10A).

Consequently, when the penetrating hole 77 is positioned at upper side than the upper surface of the substrate W, the IPA nozzle 30 is able to pass through the annular portion 71R by the penetrating hole 77. On the other hand, when the penetrating hole 77 is located lower than the upper surface of the substrate W, the liquid receiver 95 provided above the penetrating hole 77 is able to receive the processing liquid removed off from the substrate W. It is therefore suppressed that the processing liquid removed off from the substrate W leaks out to the outside of the annular portion 71R through the penetrating hole 77.

Third Preferred Embodiment

Figure 11A:
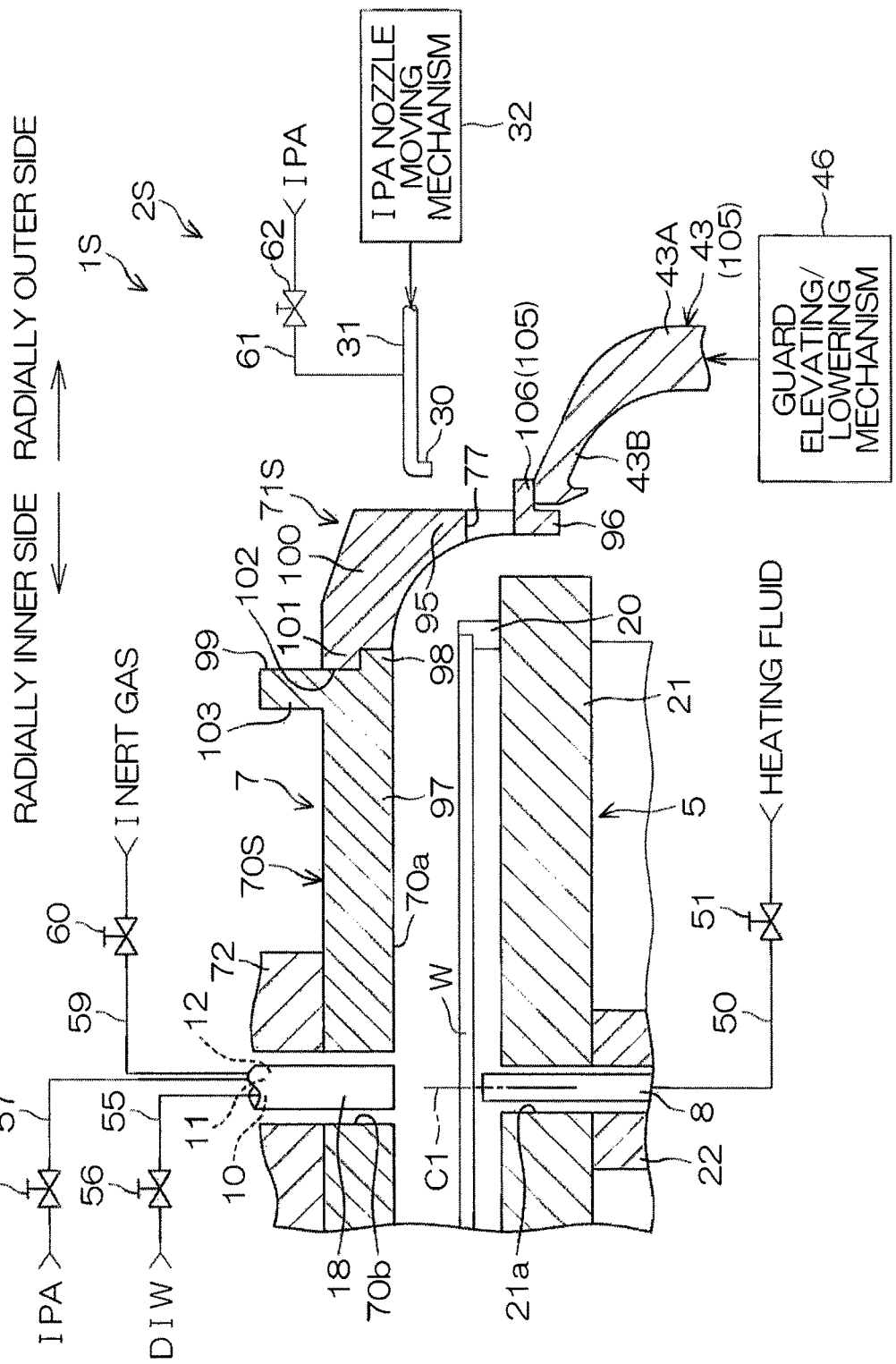
FIG. 11A and FIG. 11B are schematic cross-sectional views of the vicinity of a shielding member provided in a processing unit according to a third preferred embodiment of the present invention.
Figure 11B:
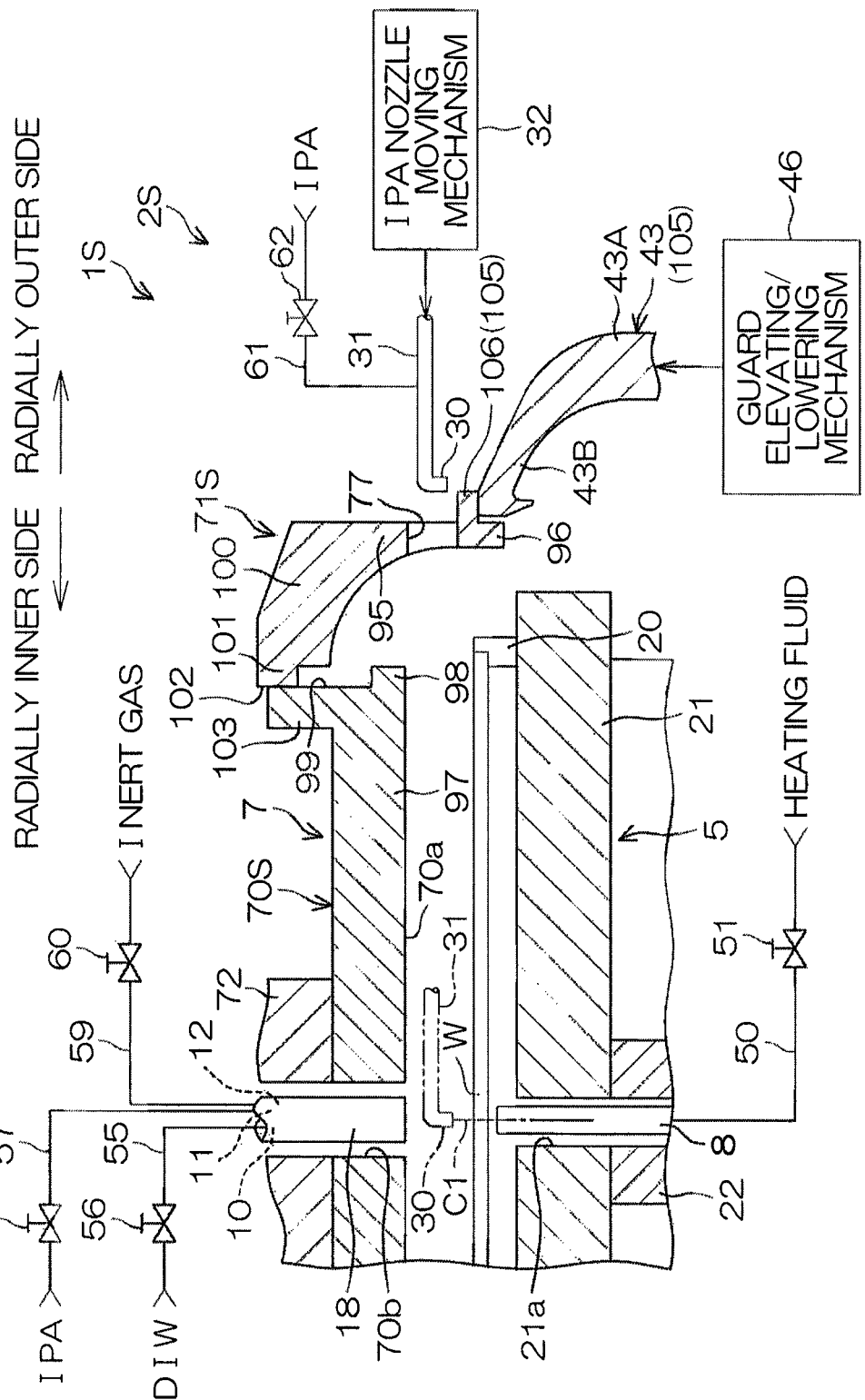

A processing unit 2S of a substrate processing apparatus 1S according to a third preferred embodiment of the present invention will now be described. FIG. 11A and FIG. 11B are schematic cross-sectional views of the vicinity of a shielding member 7 provided in the processing unit 2S according to the third preferred embodiment. In FIG. 11A and FIG. 11B, the same members as those explained above are indicated by like reference symbols, and their explanation will be omitted.

The main point of difference of the processing unit 2S of the third preferred embodiment compared to the processing unit 2 of the first preferred embodiment is that the processing unit 2S of the third preferred embodiment includes an annular portion moving mechanism 105 that moves an annular portion 71S vertically with respect to a facing portion 70S.

The facing portion 70S includes a body portion 97 that has the aforementioned facing surface 70a and communicating hole 70b and faces the upper surface of the substrate W, a supporting member 98 that extends to the radially outer side from the radially outer side end of the body portion 97, and supports the annular portion 71S by contacting from below the annular portion 71S, and a guide 99 that guides the vertical movement of the annular portion 71S with respect to the facing portion 70S.

The annular portion 71S includes the aforementioned liquid receiver 95 and penetrating hole-forming portion 96, an extension portion 100 that is provided above the liquid receiver 95 and extends in the horizontal direction, a supported member 101 that extends to the radially inner side from the radially inner side end of the extension portion 100 and is contacted by the supporting member 98 to be supported by the facing portion 70S, and a guided portion 102 that is guided by the guide 99.

The supporting member 98 is, for example, an annular protrusion that contacts the supported member 101 from below. The supported member 101 is an annular protrusion that contacts the supporting member 98 from above. The guide 99 is the outer peripheral surface of the cylinder portion 103 that extends upward from the radially outer side end of the body portion 97. The guided portion 102 is the inner peripheral surface of the supported member 101 that contacts the outer peripheral surface of the cylinder portion 103 from the radially outer side, in a slidable manner. The guided portion 102 and the guide 99 are in contact with each other in slidable manner, and thereby suppresses passage of the processing liquid and inert gas between the guided portion 102 and the guide 99.

When the supported member 101 of the annular portion 71S is contacted from below by the supporting member 98 of the facing portion 70S, and the shielding member 7 is elevated or lowered by the shielding member elevating/lowering mechanism 74, the facing portion 70S and the annular portion 71S are elevated or lowered in an integral manner. The facing portion 70S and the annular portion 71S are integrally rotatable.

The annular portion moving mechanism 105 includes the aforementioned guard 43, and a facing member 106 that extends to the radially outer side from a lower end portion of the annular portion 71S and faces the guard 43 from above. The facing member 106 may be formed integrally with the annular portion 71S, or may be provided as a separate part from the annular portion 71S.

When the guard 43 is elevated and the upper end of the guard 43 is made to contact the facing member 106 from below, the annular portion 71S is elevated with respect to the facing portion 70S. The annular portion moving mechanism 105 moves the annular portion 71 vertically with respect to the facing portion 70S, within a range in which the guide 99 of the facing portion 70S can guide the guided portion 102 of the annular portion 71S. The lowest position for vertical movement of the annular portion 71 with respect to the facing portion 70S is a position where the supported member 101 of the annular portion 71S and the supporting member 98 of the facing portion 70S are in contact.

Referring to FIG. 11A, when the supported member 101 and the supporting member 98 contact and the facing portion 70S of the shielding member 7 is positioned at a fifth proximal position between the lower position and the higher position (the position shown in FIG. 11A), the annular portion 71S faces the substrate W from the horizontal direction. In a state where the annular portion 71S is facing the substrate W from the horizontal direction, the atmosphere between the shielding member 7 and the upper surface of the substrate W is shielded from the ambient atmosphere. In this state, the penetrating hole-forming portion 96 is positioned at lower side than the substrate W. Therefore, the IPA nozzle 30 is unable to pass through the annular portion 71S via the penetrating hole 77. Moreover, since in this state, the liquid receiver 95 receives the processing liquid that has been removed off from the substrate W, fly-off of the processing liquid further toward the radially outer side than the shielding member 7 can be prevented. When the facing portion 70S is at the fifth proximal position, the IPA nozzle 30 can move in the horizontal direction between the facing surface 70a and the upper surface of the substrate W.

On the other hand, referring to FIG. 11B, when the guard 43 is elevated in a state where the facing portion 70S of the shielding member 7 positioned at the fifth proximal position, the guard 43 lifts up the facing member 106, and the annular portion 71S is elevated with respect to the facing portion 70S. The annular portion moving mechanism 105 can thus elevate the annular portion 71S with respect to the facing portion 70S. The penetrating hole 77 is thereby positioned at a higher location than the substrate W. The IPA nozzle 30 is therefore able to pass through the annular portion 71S via the penetrating hole 77.

For the present preferred embodiment, in the DIW rinse processing (S3) and organic solvent processing (S4), the controller 3 controls the shielding member elevating/lowering mechanism 74 to position the facing portion 70S at the fifth proximal position, instead of positioning the shielding member 7 at the first proximal position.

Furthermore, in the DIW rinse processing (S3) and organic solvent processing (S4), the controller 3 controls the shielding member elevating/lowering mechanism 74 to position the facing portion 70S at the fifth proximal position, instead of positioning the shielding member 7 at the second proximal position. During this time, the controller 3 controls the guard elevating/lowering mechanism 46 to elevate the guard 43, whereby the annular portion 71S is elevated with respect to the facing portion 70S to position the penetrating hole 77 at a position higher than the upper surface of the substrate W.

According to the present preferred embodiment, the annular portion moving mechanism 105 moves the annular portion 71S vertically with respect to the facing portion 70S that faces the upper surface of the substrate W. Consequently, it is possible to narrow the spacing between the upper surface of the substrate W and the facing portion 70S, and it is possible to position the penetrating hole 77 above the substrate W by moving the annular portion 71S vertically relative to the facing portion 70S. Consequently, the oxygen concentration and humidity in the atmosphere between the substrate W and the shielding member 7 can be reduced, and the IPA nozzle 30 can pass through the annular portion 71S via the penetrating hole 77.

The modification example explained for the first preferred embodiment may likewise be applied for the second preferred embodiment and third preferred embodiment as well.

The present invention is not restricted to the preferred embodiments described above and may be implemented in yet other modes.

For example, for the aforementioned preferred embodiment, the chemical liquid nozzle 9 is a moving nozzle that moves in the horizontal direction, but unlike the aforementioned preferred embodiment, the chemical liquid nozzle 9 may instead be a fixed nozzle disposed so as to discharge the chemical liquid toward the center of rotation of the upper surface of the substrate W. More specifically, the chemical liquid nozzle 9 may have a form in which the DIW nozzle 10, first inert gas nozzle 12 and central IPA nozzle 11 are inserted through the nozzle housing member 18 that has been inserted through the rotating shaft 72.

Furthermore, for the second preferred embodiment and third preferred embodiment, in a case where the chemical liquid nozzle 9 is a fixed nozzle, the liquid receiver 95 can receive the chemical liquid removed out from the substrate W, so that fouling of the penetrating hole 77 by the chemical liquid can thus be prevented.

Moreover, in the IPA replacement step of the DIW rinse processing (S3) and organic solvent processing (S4), the shielding member 7 may be disposed at the second proximal position, instead of disposing the shielding member 7 at the first proximal position (see FIG. 7C and FIG. 7D). In this case, in the subsequent liquid film forming step (see FIG. 7E) it is possible to eliminate the time required to move the position of the shielding member 7 from the first proximal position to the second proximal position such that the IPA nozzle 30 and the nozzle arm 31 can pass through the annular portion 71 via the penetrating hole 77.

Also, each processing unit 2 may include a heater that heats the substrate W in the organic solvent processing. The heater may be incorporated in the spin base 21 or may be incorporated in the shielding member 7 or may be incorporated in both the spin base 21 and the shielding member 7. If the substrate W is to be heated in the organic solvent processing, at least one among the lower surface nozzle 8, the heater incorporated in the spin base 21, and the heater incorporated in the shielding member 7 is used.

Moreover, the structure of the processing liquid supply nozzle is not limited to an IPA nozzle 30 that supplies an organic solvent such as IPA, for example, to the upper surface of the substrate W, and may be any structures as long as the processing liquid is supplied to the upper surface of the substrate W. That is, the processing liquid supply nozzle maybe a low surface tension liquid nozzle that supplies a low surface tension liquid, with surface tension lower than the rinse liquid (for example, water), to the upper surface of the substrate W, or the processing liquid supply nozzle may be a chemical liquid nozzle that supplies a chemical liquid to the upper surface of the substrate W, or the processing liquid supply nozzle may be a rinse liquid nozzle that supplies DIW or another rinse liquid to the upper surface of the substrate W. A plurality of processing liquid supply nozzles may also be provided. In this case, a plurality of penetrating holes 77 must be provided in the annular portion 71, corresponding to the number of processing liquid supply nozzles.

The chemical liquid nozzle 9 may be configured so as to be able to pass through the annular portion 71 via a passage-allowing portion such as a penetrating hole that is separate from the penetrating hole 77 of the first preferred embodiment. In this case, the shielding member 7 can be disposed at the second proximal position for the chemical liquid processing (S2). Consequently, the substrate processing time in the DIW rinse processing (S3) can be shortened, because it is sufficient to move the shielding member 7 from the second proximal position to the first proximal position, without needing to move the shielding member 7 from the higher position to the first proximal position.

Also, the inner peripheral surfaces of the penetrating holes 77, 77P, 77Q may include taper surfaces that extend downward toward the radially inner side. In this case, the processing liquid adhering to the inner peripheral surfaces of the penetrating holes 77, 77P, 77Q easily flows downward, and therefore pooling of the processing liquid in the penetrating holes 77, 77P, 77Q can be suppressed.

Moreover, sponge-shaped members that absorb processing liquid that has been removed off from the substrate W, may be provided on the inner walls of the penetrating holes 77, 77P, 77Q and the notch 78. The passage of the processing liquid that has been removed off from the substrate W, through the annular portion 71 via the penetrating holes 77, 77P, 77Q and the notch 78, can thus be suppressed.

In addition, grooves that depress the facing surface 70a upwardly and extend in the rotational radius direction may be provided in the facing portions 70, 70S. When the IPA nozzle 30 moves in the horizontal direction, preferably the IPA nozzle 30 and nozzle arm 31 move along the grooves. The interval between the upper surface of the substrate W and the facing portion 70 can thus be narrowed, even when the IPA nozzle 30 is positioned between the substrate W and the facing surface 70a.

The IPA nozzle moving mechanism 32 may also include a pivoting shaft having a pivoting shaft axis that is coupled with one end of the nozzle arm 31 and extends in the vertical direction. In this case, the nozzle arm 31 revolves around the vertical pivoting shaft axis.

Moreover, the IPA nozzle moving mechanism 32 may include a pivoting shaft having a pivoting shaft axis that is coupled with one end of the nozzle arm 31 and extends in the vertical direction, and the nozzle arm 31 may include a first axis extending from the pivoting shaft in a linear manner in the horizontal direction, and a second axis extending from the tip of the first axis in the direction of rotation of the pivoting shaft. In this case, the IPA nozzle 30 is provided at the tip of the second axis of the nozzle arm 31, and is movable in the direction in which the second axis of the nozzle arm 31 extends (the direction of its rotation).

While preferred embodiments of the present invention have been described above, it is to be understood that variations and modifications will be apparent to those skilled in the art without departing the scope and spirit of the present invention. The scope of the present invention, therefore, is to be determined solely by the following claims.

The present application corresponds to Japanese Patent Application No. 2016-99403 filed on May 18, 2016 in the Japan Patent Office, and the entire disclosure of this application is incorporated herein by reference.

What is claimed is:

1. A substrate processing apparatus comprising:
    a substrate holding unit that holds a substrate horizontally;
    a substrate rotating unit that rotates the substrate held by the substrate holding unit around a prescribed rotational axis extending along a vertical direction;
    a processing liquid supply nozzle that moves in a horizontal direction and supplies a processing liquid onto an upper surface of the substrate held by the substrate holding unit;
    a shielding member that shields an atmosphere between the shielding member and the upper surface of the substrate held by the substrate holding unit from an ambient atmosphere, and includes an annular portion that surrounds the substrate held by the substrate holding unit and a passage-allowing portion that is provided at the annular portion and allows the processing liquid supply nozzle to pass through the annular portion;
    an inert gas supply unit that supplies an inert gas between the upper surface of the substrate held by the substrate holding unit and the shielding member;
    a shielding member rotating unit that rotates the shielding member around the rotational axis; and
    a controller that is programmed so as to control the shielding member rotating unit to adjust a position of the passage-allowing portion in the rotational direction such that the processing liquid supply nozzle is to be passed through the annular portion.

2. A substrate processing apparatus according to claim 1, wherein the processing liquid supply nozzle moves through the passage-allowing portion, between a location more toward the rotational axis side than the annular portion and a location on an opposite side of the rotational axis with respect to the annular portion.

3. A substrate processing apparatus according to claim 1, further comprising a shielding member elevating/lowering unit that elevates and lowers the shielding member;
    wherein the annular portion further includes a liquid receiver that is provided at upper side than the passage-allowing portion and receives the processing liquid removed off from the substrate.

4. A substrate processing apparatus according to claim 1, wherein the shielding member includes a facing portion that faces the upper surface of the substrate held by the substrate holding unit,
    the substrate processing apparatus further comprises an annular portion moving mechanism that moves the annular portion vertically with respect to the facing portion.

5. A substrate processing apparatus according to claim 1, wherein the passage-allowing portion includes a penetrating hole that penetrates through the annular portion.

6. A substrate processing apparatus according to claim 1, wherein the passage-allowing portion includes a notch where the annular portion is notched upward from the bottom end.

7. A substrate processing apparatus according to claim 1, further comprising:
    an axis-shaped nozzle arm that supports the processing liquid supply nozzle and extends in the horizontal direction; and
    a nozzle rotating unit that rotates the processing liquid supply nozzle around a central axis of the nozzle arm;
    wherein the processing liquid supply nozzle extends in a direction crossing the central axis of the nozzle arm; and
    the passage-allowing portion includes a long hole that is long in the horizontal direction and penetrates through the annular portion.

8. A substrate processing apparatus according to claim 1, further comprising a processing liquid passage suppressing unit that suppresses the processing liquid removed off from the substrate held by the substrate holding unit, from passing through the annular portion via the passage-allowing portion.

* * * * *